(12) United States Patent
Hase

(10) Patent No.: US 12,458,323 B2
(45) Date of Patent: Nov. 4, 2025

(54) ULTRASOUND PROBE, ULTRASOUND DIAGNOSTIC APPARATUS, AND MANUFACTURING METHOD OF ULTRASOUND PROBE

(71) Applicant: FUJIFILM Corporation, Tokyo (JP)

(72) Inventor: Takatoshi Hase, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 132 days.

(21) Appl. No.: 18/477,995

(22) Filed: Sep. 29, 2023

(65) Prior Publication Data

US 2024/0023932 A1 Jan. 25, 2024

Related U.S. Application Data

(63) Continuation of application No. PCT/JP2022/010981, filed on Mar. 11, 2022.

(30) Foreign Application Priority Data

Apr. 1, 2021 (JP) ................................ 2021-063176

(51) Int. Cl.
*A61B 8/00* (2006.01)
*B06B 1/06* (2006.01)

(52) U.S. Cl.
CPC .......... *A61B 8/4444* (2013.01); *B06B 1/0692* (2013.01)

(58) Field of Classification Search
CPC ... A61B 8/4444; A61B 8/4483; A61B 8/4494; B06B 1/0692; B06B 1/0622; B06B 1/067
See application file for complete search history.

(56) References Cited

U.S. PATENT DOCUMENTS

2002/0156373 A1* 10/2002 Wakabayashi ........ B06B 1/0622
600/437
2003/0009873 A1* 1/2003 Hatangadi ............. B06B 1/0607
29/594

(Continued)

FOREIGN PATENT DOCUMENTS

WO 2018/070159 A1 4/2018

OTHER PUBLICATIONS

International Search Report issued in PCT/JP2022/010981; mailed May 24, 2022.

(Continued)

*Primary Examiner* — Joel Lamprecht
*Assistant Examiner* — James F McDonald, III
(74) *Attorney, Agent, or Firm* — Studebaker Brackett PLLC

(57) ABSTRACT

An ultrasound includes: an acoustic matching portion disposed on a plurality of piezoelectric elements; and a conductive member disposed on the plurality of piezoelectric elements and adjacent to the acoustic matching portion, in which the conductive member includes a conductor layer having a multi-layer structure, which is disposed on at least one end side of the acoustic matching portion in a second direction intersecting the first direction, the conductor layer having a multi-layer structure includes a plurality of first conductor layers respectively bonded to the second conductive portions of the piezoelectric elements, and a second conductor layer laminated on the plurality of first conductor layers and electrically connects the plurality of first conductor layers, and a ratio of a thickness to a width, which is a length in the first direction, of the first conductor layer is 1.6 or less.

19 Claims, 23 Drawing Sheets

A-A

(56) References Cited

U.S. PATENT DOCUMENTS

| | | | | |
|---|---|---|---|---|
| 2009/0062655 A1* | 3/2009 | Saito | ................ | A61B 8/4444 |
| | | | | 600/459 |
| 2015/0289843 A1* | 10/2015 | Wada | ................ | A61B 8/4494 |
| | | | | 29/25.35 |
| 2017/0043189 A1* | 2/2017 | Stoddard | ............ | G10K 11/24 |
| 2017/0080255 A1 | 3/2017 | Law et al. | | |
| 2019/0231310 A1* | 8/2019 | Osawa | ............ | H04R 17/00 |
| 2019/0366384 A1* | 12/2019 | Pang | .............. | G10K 11/30 |
| 2021/0015458 A1* | 1/2021 | Kitamura | ............ | A61B 8/12 |

OTHER PUBLICATIONS

Written Opinion of the International Searching Authority issued in PCT/JP2022/010981; mailed May 24, 2022.

The extended European search report issued by the European Patent Office on Jul. 12, 2024, which corresponds to European Patent Application No. 22779993.9-1001 and is related to U.S. Appl. No. 18/477,995.

\* cited by examiner

FIG. 23

| VERIFICATION NUMBER | WIDTH D1 [μm] | FIRST CONDUCTOR LAYER | | TILT·FALL RATE [%] | EVALUATION |
| --- | --- | --- | --- | --- | --- |
| | | REAR SIDE (DICING cut-in SIDE) RATIO (HR/D1) | FRONT SIDE (DICING cut-out SIDE) RATIO (HF/D1) | | |
| EXAMPLE 1 | 25 | 0.4 | 0.4 | 0 | OK |
| EXAMPLE 2 | 25 | 0.4 | 1.4 | 0 | OK |
| EXAMPLE 3 | 25 | NONE | 1.4 | 0 | OK |
| EXAMPLE 4 | 25 | 0.4 | 1.6 | 0 | OK |
| REFERENCE EXAMPLE 1 | 40 | 2.6 | 2.6 | 0 | OK |
| REFERENCE EXAMPLE 2 | 63 | 2.3 | 2.3 | 0 | OK |
| COMPARATIVE EXAMPLE 1 | 25 | 0.4 | 1.8 | 2 | NG |
| COMPARATIVE EXAMPLE 2 | 25 | 0.4 | 1.7 | 1 | NG |

ULTRASOUND PROBE, ULTRASOUND DIAGNOSTIC APPARATUS, AND MANUFACTURING METHOD OF ULTRASOUND PROBE

CROSS REFERENCE TO RELATED APPLICATION

This is a continuation of International Application No. PCT/JP2022/010981 filed on Mar. 11, 2022, and claims priority from Japanese Patent Application No. 2021-063176 filed on Apr. 1, 2021, the entire disclosures of which are incorporated herein by reference.

BACKGROUND OF THE INVENTION

1. Field of the Invention

The present invention relates to an ultrasound probe, an ultrasound diagnostic apparatus, and a manufacturing method of an ultrasound probe.

2. Description of the Related Art

In a medical field, an ultrasound diagnostic apparatus using an ultrasound image has been put into practical use. In this type of ultrasound diagnostic apparatus, an ultrasound image is generated by transmitting an ultrasound beam from an ultrasound probe toward a subject, receiving an ultrasound echo from the subject through the ultrasound probe, and electrically processing a reception signal thereof.

In an ultrasound diagnosis field, a need for a high-definition ultrasound image is increasing more than ever as a range of an observation target widens. In order to acquire the high-definition ultrasound image, it is necessary to transmit and receive high-frequency ultrasonic wave, but in a case in which an element pitch of a piezoelectric element is not made fine according to an ultrasonic frequency, a quality of the ultrasound image is affected by generation of grating lobes.

WO2018/070159A discloses an ultrasound probe aimed at suppressing a decrease in sensitivity in a case in which the element pitch of the piezoelectric element is made fine.

SUMMARY OF THE INVENTION

WO2018/070159A discloses that, in a case in which a driving frequency of the piezoelectric element exceeds 15 MHz, the element pitch is preferably 150 μm or less. However, no further high-frequency drive is mentioned.

An object of the present invention is to provide an ultrasound probe capable of supporting high-frequency drive, a manufacturing method thereof, and an ultrasound diagnostic apparatus.

According to one aspect of the present invention, there is provided an ultrasound probe having a plurality of piezoelectric elements arranged in a first direction, the ultrasound probe comprising: a support member that supports the plurality of piezoelectric elements; an acoustic matching portion disposed on the plurality of piezoelectric elements; and a conductive member disposed on the plurality of piezoelectric elements and adjacent to the acoustic matching portion, in which each of the plurality of piezoelectric elements is formed of a laminate including a first conductive portion, a piezoelectric portion, and a second conductive portion which are sequentially laminated above the support member, the conductive member includes a conductor layer having a multi-layer structure, which is disposed on at least one end side of the acoustic matching portion in a second direction intersecting the first direction, the conductor layer having a multi-layer structure includes a plurality of first conductor layers respectively bonded to the second conductive portions of the piezoelectric elements, and a second conductor layer laminated on the plurality of first conductor layers and electrically connects the plurality of first conductor layers, and a ratio of a thickness to a width of the first conductor layer is 1.6 or less, the width of the first conductor layer being a length of the first conductor layer in the first direction.

According to another aspect of the present invention, there is provided an ultrasound diagnostic apparatus comprising: the ultrasound probe described above.

According to still another aspect of the present invention, there is provided a manufacturing method of an ultrasound probe which has a plurality of piezoelectric elements arranged in a first direction and in which a width of the piezoelectric element is a predetermined value, the width of the piezoelectric element being a length in the first direction, in which a direction intersecting the first direction is defined as a second direction, and a direction perpendicular to the first direction and the second direction is defined as a third direction, and the manufacturing method comprises: a step of fixing to a support member, a sheet-like laminate which is perpendicular to the third direction and in which a first conductive portion, a piezoelectric portion, and a second conductive portion are sequentially laminated; a step of forming an acoustic matching portion in a partial region in the second direction of an upper surface of the laminate, the upper surface being an opposite side to a support member side; a step of forming a first conductor layer whose thickness in the third direction is equal to or less than 1.6 times the predetermined value on at least one end side of the acoustic matching portion in the second direction on the upper surface of the laminate; a step of forming the plurality of piezoelectric elements by dividing the laminate on which the acoustic matching portion and the first conductor layer are formed into a plurality of parts in the first direction by cutting; and a step of forming, on the first conductor layers divided into the plurality of parts, a second conductor layer extending over a plurality of the first conductor layers.

According to the present invention, it is possible to provide an ultrasound probe capable of supporting high-frequency drive, a manufacturing method thereof, and an ultrasound diagnostic apparatus.

BRIEF DESCRIPTION OF THE DRAWINGS

FIG. 23 is a diagram showing a verification result of an ultrasound probe.

DESCRIPTION OF THE PREFERRED EMBODIMENTS

Figure 1:
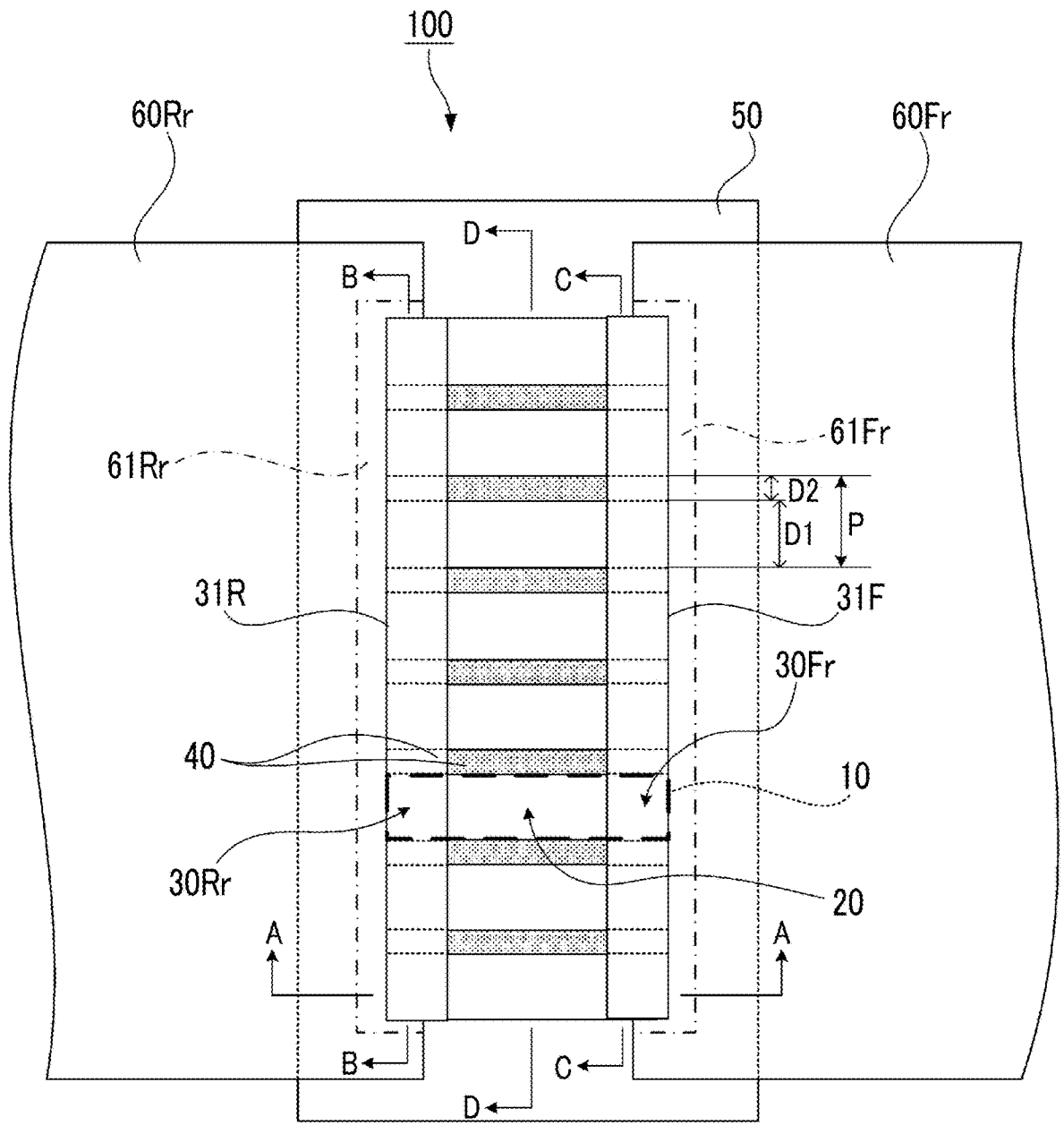
FIG. 1 is a schematic plan view showing a schematic configuration of an ultrasound probe 100, which is an embodiment of an ultrasound probe of the present invention.
Figure 1:
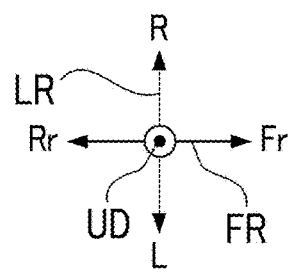
Figure 2:
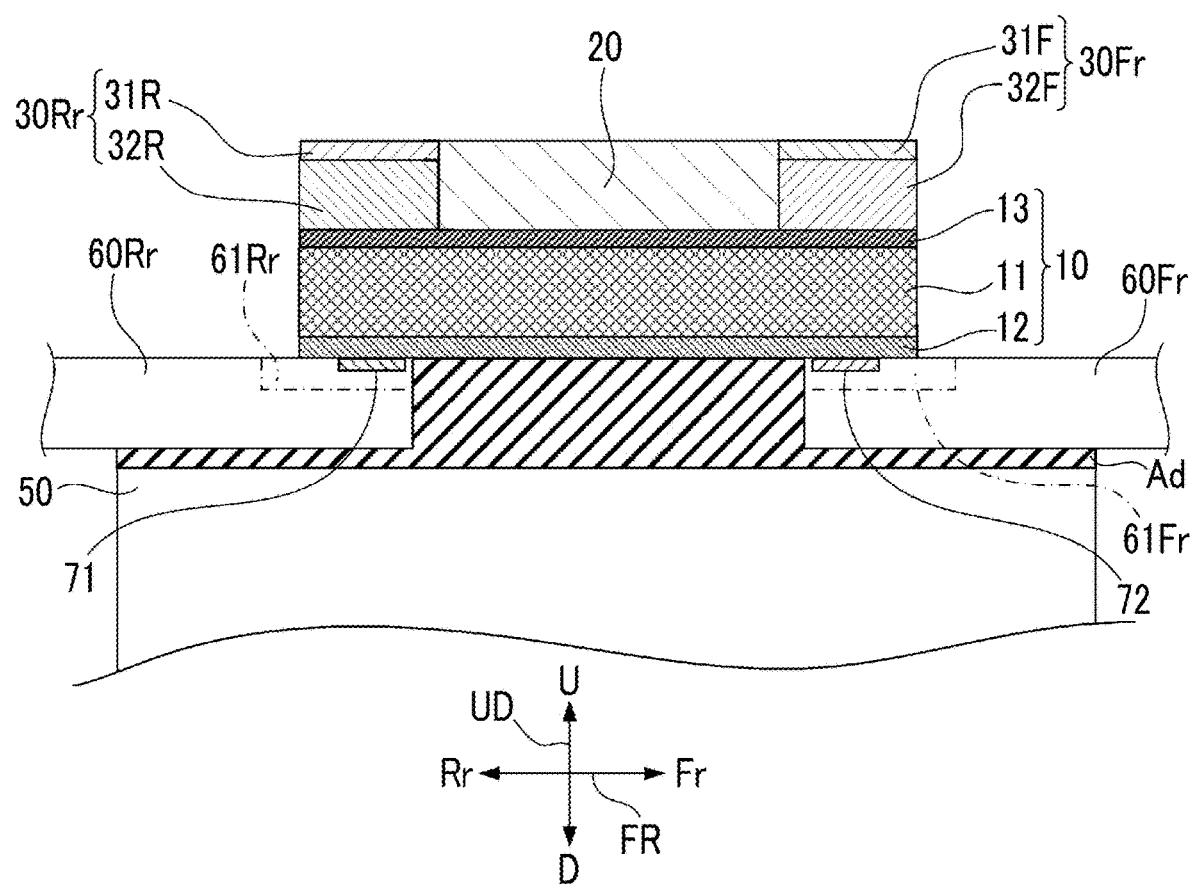
FIG. 2 is a schematic cross-sectional view taken along the line A-A in FIG. 1.
Figure 3:
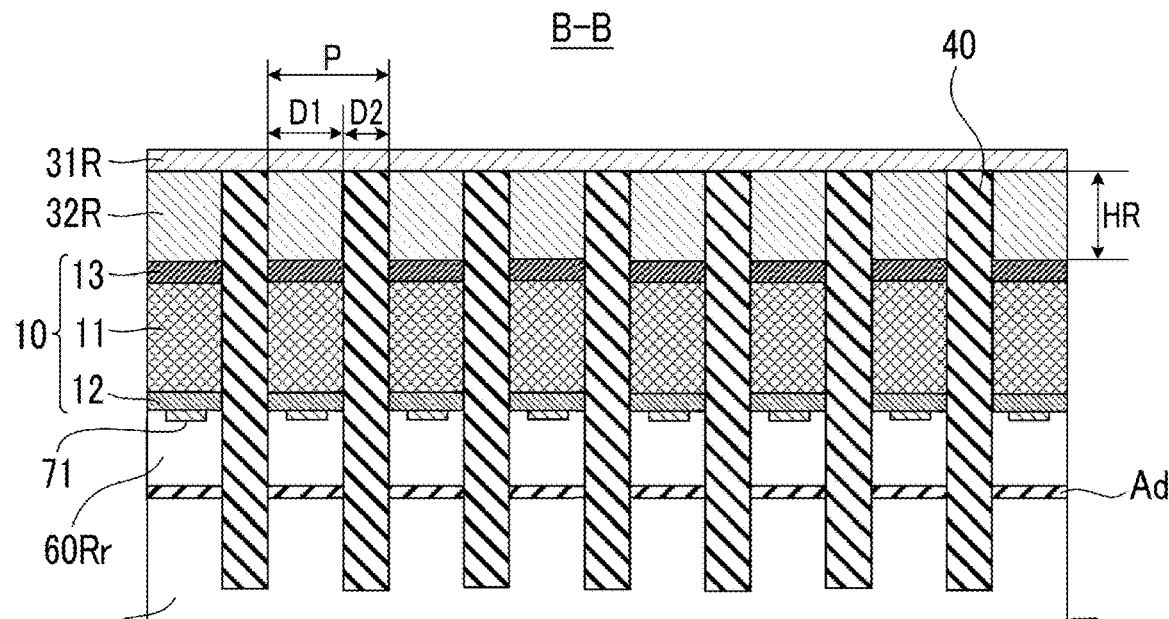
FIG. 3 is a schematic cross-sectional view taken along the line B-B and the line C-C in FIG. 1.
Figure 3:
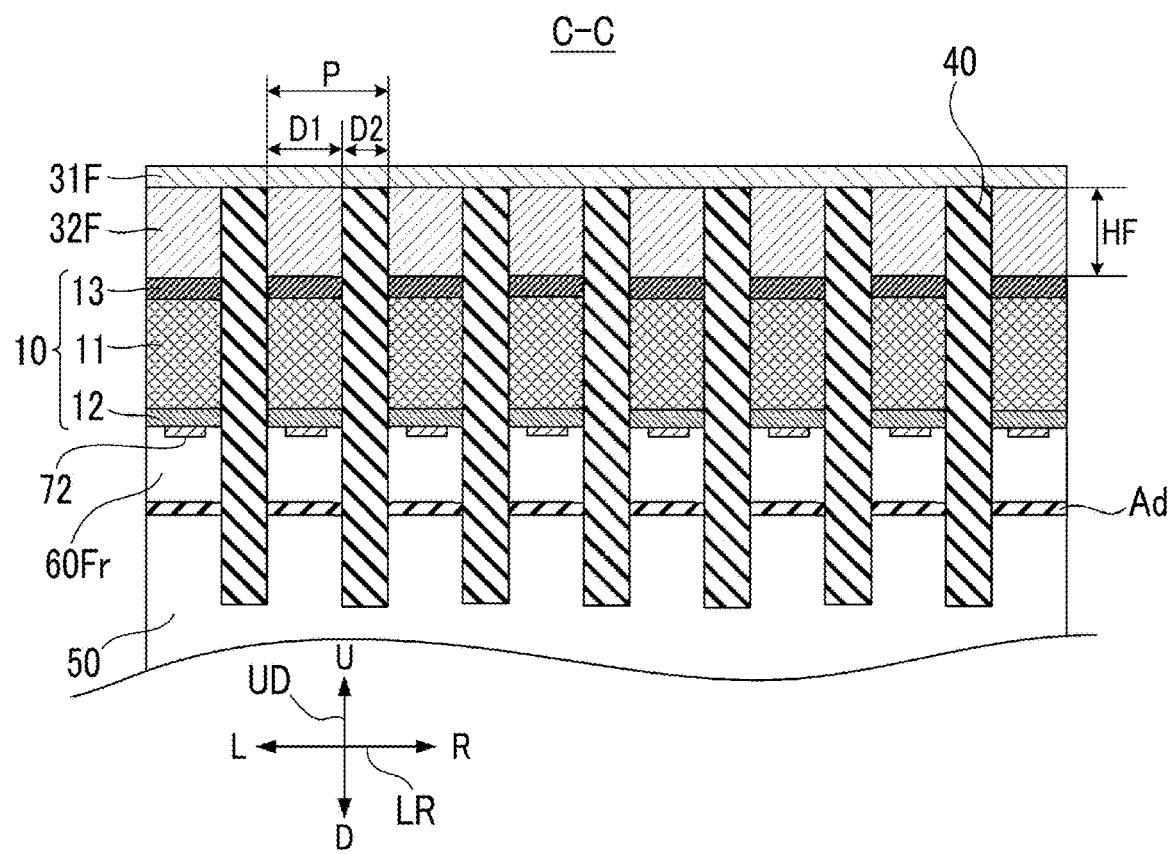
Figure 4:
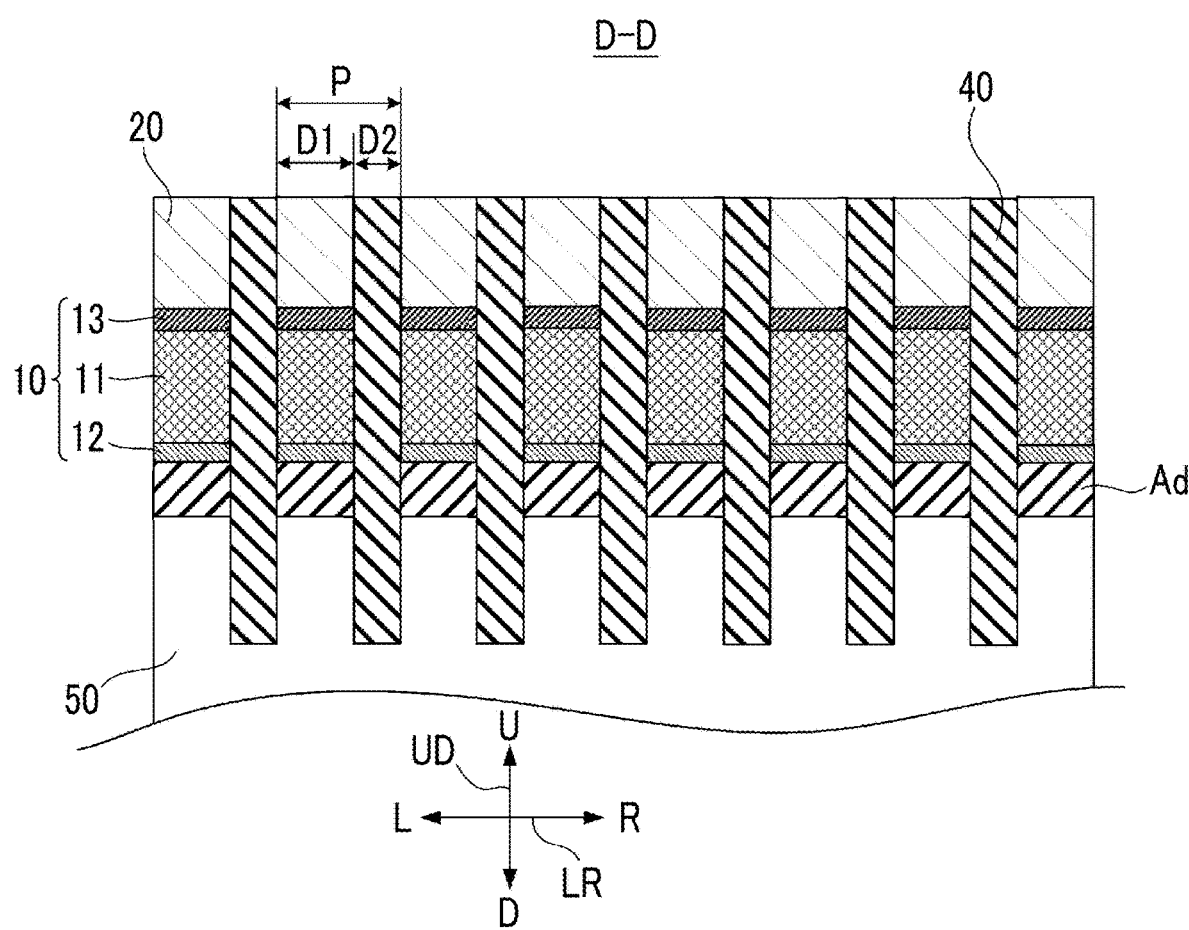
FIG. 4 is a schematic cross-sectional view taken along the line D-D in FIG. 1.

FIG. 1 is a schematic plan view showing a schematic configuration of an ultrasound probe 100, which is an embodiment of an ultrasound probe of the present invention. FIG. 2 is a schematic cross-sectional view taken along the line A-A in FIG. 1. FIG. 3 is a schematic cross-sectional view taken along the line B-B and the line C-C in FIG. 1. FIG. 4 is a schematic cross-sectional view taken along the line D-D in FIG. 1. The ultrasound probe 100 is an image generation device provided in an ultrasound diagnostic apparatus. The ultrasound diagnostic apparatus includes a device that generates and records an ultrasound image while bringing the ultrasound probe 100 into proximity with an outer surface of a subject, a device that generates and records an ultrasound image while bringing the ultrasound probe 100 incorporated into an insertion part distal end of an endoscope into proximity with an organ of the subject, or the like.

In the present specification, a right direction of a paper surface in FIG. 1 is described as a front direction Fr of the ultrasound probe 100, a left direction of the paper surface in FIG. 1 is described as a rear direction Rr of the ultrasound probe 100, and these are collectively described as a front-rear direction FR. In addition, an upward direction of the paper surface in FIG. 1 is described as a right direction R of the ultrasound probe 100, a downward direction of the paper surface in FIG. 1 is described as a left direction L of the ultrasound probe 100, and these are collectively described as a left-right direction LR. In addition, a direction perpendicular to the front-rear direction FR and the left-right direction LR is described as an up-down direction UD. Of the up-down direction UD, a direction from the front to the back of the paper surface in FIG. 1 is described as a downward direction D of the ultrasound probe 100, and a direction from the back to the front of the paper surface in FIG. 1 is described as an upward direction U of the ultrasound probe 100.

[Overall Configuration of Ultrasound Probe]

The ultrasound probe 100 comprises a backing material 50, a front flexible printed circuit (FPC) 60Fr and a rear FPC 60Rr (see FIG. 1) supported by the backing material 50, a plurality of (8 pieces in an example of FIG. 1) piezoelectric elements 10 (see FIGS. 3 and 4) supported by the backing material 50 and arranged in the left-right direction LR, an acoustic matching portion 20 (see FIG. 4) provided on each piezoelectric element 10 in correspondence with the piezoelectric element 10, a first conductor layer 32F and a first conductor layer 32R (see FIG. 3) provided on each piezoelectric element 10 in correspondence with the piezoelectric element 10, and a second conductor layer 31F and a second conductor layer 31R (see FIGS. 1 and 3) provided in common to all the piezoelectric elements 10. Each of the first conductor layer 32F, the first conductor layer 32R, the second conductor layer 31F, and the second conductor layer 31R is formed of a conductive material such as a metal or a metal compound.

As shown in FIGS. 1 and 2, the front FPC 60Fr and the rear FPC 60Rr are fixed to the backing material 50 with an adhesive Ad such as an epoxy resin in a state where the front FPC 60Fr and the rear FPC 60Rr are arranged side by side at an interval in the front-rear direction FR. As shown in FIG. 1, an electrode pattern forming region 61Fr is provided at a rear end portion of the front FPC 60Fr. In addition, an electrode pattern forming region 61Rr is provided at a front end portion of the rear FPC 60Rr.

As shown in a C-C cross section of FIG. 3, in the electrode pattern forming region 61Fr, line electrodes 72 corresponding to the piezoelectric elements 10 are arranged in the left-right direction LR. In addition, as shown in a B-B cross section of FIG. 3, in the electrode pattern forming region 61Rr, line electrodes 71 corresponding to the piezoelectric elements 10 are arranged in the left-right direction LR.

As shown in FIGS. 3 and 4, the plurality of piezoelectric elements 10 are arranged above the backing material 50 in the left-right direction LR with a predetermined arrangement pitch P. Each of the piezoelectric elements 10 is configured of a laminate in which a first conductive portion 12 formed of a conductive material, a piezoelectric portion 11 formed of a piezoelectric material, and a second conductive portion 13 formed of a conductive material are sequentially laminated above the backing material 50. The first conductive portion 12 is fixed to a surface (lower surface) of the piezoelectric portion 11 on the backing material 50 side by vapor deposition or the like, and the second conductive portion 13 is fixed to a surface (upper surface) of the piezoelectric portion 11 opposite to the backing material 50 side by vapor deposition or the like. The first conductive portion 12 functions as a signal electrode of the piezoelectric element 10. The second conductive portion 13 functions as a ground electrode for taking a reference potential with respect to a potential of the first conductive portion 12.

As shown in FIGS. 2 and 3, the first conductive portion 12 of the piezoelectric element 10 is disposed above the line electrode 71 and the line electrode 72 corresponding to the piezoelectric element 10, and is electrically connected to the line electrode 71 and the line electrode 72 by a conductive material such as silver (not shown). The front FPC 60Fr and the rear FPC 60Rr are provided with connectors (not shown) connected to the line electrode 71 and the line electrode 72, and the connectors are electrically connected to a main body of the ultrasound diagnostic apparatus. Therefore, it is possible to control the potential of the first conductive portion 12 of the piezoelectric element 10 and acquire the potential of the first conductive portion 12 of the piezoelectric element 10 from the main body of the ultrasound diagnostic apparatus via the line electrode 71 and the line electrode 72.

As shown in FIG. 2, the acoustic matching portion 20, the first conductor layer 32F, and the first conductor layer 32R are disposed on the second conductive portion 13 of the corresponding piezoelectric element 10. The acoustic matching portion 20 is fixed onto the second conductive portion 13 by adhesion or the like. The first conductor layer 32F is disposed adjacent to the acoustic matching portion 20 on a front side of the acoustic matching portion 20. The first conductor layer 32R is disposed adjacent to the acoustic matching portion 20 on a rear side of the acoustic matching portion 20. The first conductor layer 32F and the first conductor layer 32R corresponding to each piezoelectric element 10 are electrically connected to the second conductive portion 13 of the piezoelectric element 10, and function as a ground electrode.

A portion including the piezoelectric element 10, and the acoustic matching portion 20, the first conductor layer 32F, and the first conductor layer 32R, which correspond to the piezoelectric element 10, is described as a detection unit. A gap is formed between the detection unit and the adjacent detection unit, and these detection units are separated from each other via the gap. As shown in FIGS. 3 and 4, the gaps between the detection units adjacent to each other are filled with an insulating filling material 40, whereby positions of a plurality of the detection units are fixed.

A width D1 of the detection unit in the left-right direction LR is uniform over the up-down direction UD. In other words, the piezoelectric element 10, the acoustic matching portion 20, the first conductor layer 32F, and the first conductor layer 32R constituting the detection unit have the same width in the left-right direction LR. A width D2 of the insulating filling material 40 in the left-right direction LR is uniform over the up-down direction UD. A total value of the width D1 and the width D2 is the arrangement pitch P of the plurality of piezoelectric elements 10. From the viewpoint of acquiring a high-definition ultrasound image and suppressing the generation of grating noise, it is effective to reduce the arrangement pitch P.

As shown in FIGS. 1 and 3, the second conductor layer 31F has an elongated rectangular shape extending in the left-right direction LR, and is disposed extending over the eight first conductor layers 32F on the first conductor layers 32F disposed on the piezoelectric elements 10. That is, the second conductor layer 31F is electrically connected to the first conductor layer 32F corresponding to each piezoelectric element 10, and functions as a ground electrode.

As shown in FIGS. 1 and 3, the second conductor layer 31R has an elongated rectangular shape extending in the left-right direction LR, and is disposed extending over the eight first conductor layers 32R on the first conductor layers 32R disposed on the piezoelectric elements 10. That is, the second conductor layer 31R is electrically connected to the first conductor layer 32R corresponding to each piezoelectric element 10, and functions as a ground electrode. The second conductor layer 31F and the second conductor layer 31R are connected to a ground (not shown).

As shown in FIGS. 1 and 2, the first conductor layer 32F corresponding to the piezoelectric element 10 and the second conductor layer 31F disposed on the first conductor layer 32F constitute a conductive member 30Fr having a multi-layer structure, which is provided adjacent to the acoustic matching portion 20 corresponding to the piezoelectric element 10 and disposed on the second conductive portion 13 of the piezoelectric element 10. In addition, the first conductor layer 32R corresponding to the piezoelectric element 10 and the second conductor layer 31R disposed on the first conductor layer 32R constitute a conductive member 30Rr having a multi-layer structure, which is provided adjacent to the acoustic matching portion 20 corresponding to the piezoelectric element 10 and disposed on the second conductive portion 13 of the piezoelectric element 10.

[Details of Components of Ultrasound Probe]

The backing material 50 supports the plurality of piezoelectric elements 10 and absorbs ultrasonic waves emitted from the piezoelectric elements 10 in the downward direction D. The backing material 50 is formed of, for example, a rubber material, such as ferrite rubber.

The piezoelectric portion 11 of the piezoelectric element 10 is formed of a piezoelectric material. Examples of the piezoelectric material include piezoelectric ceramics such as lead zirconate titanate (PZT), and a polymer material such as vinylidene fluoride (PVDF).

The acoustic matching portion 20 matches acoustic impedances of the piezoelectric portion 11 of the piezoelectric element 10 and the subject to facilitate the incidence of the ultrasonic waves into the subject. The acoustic matching portion 20 can be formed of a material having an acoustic impedance that is a value lower than the acoustic impedance of the piezoelectric portion 11 and higher than the acoustic impedance of the subject. In addition, the acoustic matching portion 20 can also be formed by laminating a plurality of layers formed of such a material. For example, by laminating, on an acoustic matching layer disposed on the second conductive portion 13 of the piezoelectric element 10, an acoustic matching layer formed of a material having an acoustic impedance lower than that of the acoustic matching layer, a layer structure in which the acoustic impedance gradually decreases from the piezoelectric portion 11 toward the subject is formed.

Each of the first conductor layer 32F, the first conductor layer 32R, the second conductor layer 31F, and the second conductor layer 31R is not limited as long as it is a conductive material, but is preferably formed of silver. Each of the first conductor layer 32F, the first conductor layer 32R, the second conductor layer 31F, and the second conductor layer 31R is preferably formed of a conductive material having an acoustic impedance that is a value lower than the acoustic impedance of the piezoelectric portion 11 and higher than the acoustic impedance of the subject.

The insulating filling material 40 is formed of an insulating resin material or the like. Examples of the resin material include a silicone resin and an epoxy resin.

Although not shown in FIG. 1, in the ultrasound probe 100, an acoustic lens may be fixed to upper surfaces of the conductive member 30Fr, the conductive member 30Rr, the acoustic matching portion 20, and the insulating filling material 40.

[Operation of Ultrasound Probe]

By applying a pulsed or continuous wave voltage between the first conductive portion 12 of the plurality of piezoelectric elements 10 and the conductive member 30Rr and the conductive member 30Fr connected to the second conductive portion 13 of the plurality of piezoelectric elements 10, each of the piezoelectric portions 11 expands and contracts to generate pulsed or continuous ultrasonic waves. In a case in which these ultrasound waves are incident into the subject via the acoustic matching portion 20, the ultrasound waves are combined with each other to form an ultrasound beam and propagate through the subject. In a case in which an ultrasound echo propagating through and reflected in the subject is incident on each of the piezoelectric portions 11 via the acoustic matching portion 20, each of the piezoelectric portions 11 is deformed, and, in response to this deformation, a signal voltage is generated between the first conductive portion 12 and the second conductive portion 13. The signal voltage generated in the plurality of piezoelectric elements 10 is extracted from between the first conductive portion 12 of each of the piezoelectric elements 10 and the conductive member 30Fr and the conductive member 30Rr and received as a reception signal, and an ultrasound image is generated based on the reception signal.

[Preferable Forms of First Conductor Layer 32R and First Conductor Layer 32F]

As described above, from the viewpoint of acquiring a high-definition ultrasound image and suppressing the generation of grating noise, it is effective to reduce the arrangement pitch P. The gap between the detection units is formed by cutting using a dicing saw described in a manufacturing process described below. At present, a lower limit of a width of a dicing blade mounted on the dicing saw is about 15 μm. That is, since the width D2 shown in FIGS. 3 and 4 cannot be made smaller than 15 μm, it is necessary to reduce the width D1 of the detection unit in order to reduce the arrangement pitch P.

As the width D1 becomes smaller, for example, an adhesion area between the piezoelectric element 10 and the acoustic matching portion 20, an adhesion area between the piezoelectric element 10 and the backing material 50, and the like become smaller. Therefore, in order to alleviate thermal strain caused by a difference in a thermal expansion coefficient between the members constituting the detection unit, it is effective to prevent the ultrasound probe 100 from being placed in a high temperature environment in the manufacturing process. In addition, in order to ensure the performance of the ultrasound probe 100, it is important to prevent the ultrasound probe 100 from being exposed to a high temperature environment during the manufacturing process. In a case in which the ultrasound probe 100 is prevented from being placed in a high temperature environment in the manufacturing process as described above, a hardness of the first conductor layer 32R and the first conductor layer 32F may be smaller than a hardness of the acoustic matching portion 20 and the piezoelectric element 10, in the detection unit.

In addition, in the detection unit, the first conductor layer 32R and the first conductor layer 32F may each have a smaller volume than the acoustic matching portion 20 and the piezoelectric element 10. Therefore, as the width D1 becomes smaller, a bonding area between the first conductor layer 32R and the first conductor layer 32F and the other components becomes smaller.

By reducing the width D1 in this manner, in a case in which the bonding area between the first conductor layer 32R and the first conductor layer 32F and the other components is reduced, or the hardness of the first conductor layer 32R and the first conductor layer 32F is reduced, in a dicing process for forming the detection unit, the first conductor layer 32R and the first conductor layer 32F may fall in the left-right direction LR due to a force exerted from the dicing blade and a water flow for cooling and cutting chip removal, and the acoustic matching portion 20 and the piezoelectric element 10 may also fall under the influence of the falling of the first conductor layer 32R and the first conductor layer 32F.

As a result of the verification, it was found that, by setting a ratio (HF/D1) of a thickness (thickness HF shown in FIG. 3), which is a length in the up-down direction UD, of the first conductor layer 32F to a width (width D1 shown in FIG. 3), which is a length in the left-right direction LR, of the first conductor layer 32F to 1.6 or less (in other words, by setting the thickness HF to be equal to or less than 1.6 times the width D1), it is possible to suppress the falling of the first conductor layer 32F in the left-right direction LR even though the width D1 is reduced, or the hardness of the first conductor layer 32F is reduced. Specifically, it was found that, by setting the ratio (HF/D1) to 1.6 or less, it is possible to suppress the falling of the first conductor layer 32F in the left-right direction LR even though the width D1 is set to a small value of 25 μm or more and less than 40 μm (equivalent to the ultrasound probe 100 capable of driving from 20 MHz to 23 MHz). In addition, it was found that, by setting the ratio (HF/D1) to 1.6 or less, it is possible to suppress the falling of the first conductor layer 32F in the left-right direction LR even though a Shore D hardness (hardness measured by a D-type tester (durometer type D) specified in Japanese Industrial Standard (JIS) Z 2246) of the first conductor layer 32F is in a range of 80 or more and 85 or less, that is, even though the ultrasound probe 100 is not placed in a high temperature environment in the manufacturing process.

Similarly, it was found that, by setting a ratio (HR/D1) of a thickness (thickness HR shown in FIG. 3), which is a length in the up-down direction UD, of the first conductor layer 32R to a width (width D1 shown in FIG. 3), which is a length in the left-right direction LR, of the first conductor layer 32R to 1.6 or less (in other words, by setting the thickness HR to be equal to or less than 1.6 times the width D1), it is possible to suppress the falling of the first conductor layer 32R in the left-right direction LR even though the width D1 is reduced, or the hardness of the first conductor layer 32R is reduced. Specifically, it was found that, by setting the ratio (HR/D1) to 1.6 or less, it is possible to suppress the falling of the first conductor layer 32R in the left-right direction LR even though the width D1 is set to a small value of 25 μm or more and less than 40 μm (equivalent to the ultrasound probe 100 capable of driving from 20 MHz to 23 MHz). In addition, it was found that, by setting the ratio (HR/D1) to 1.6 or less, it is possible to suppress the falling of the first conductor layer 32R in the left-right direction LR even though a Shore D hardness of the first conductor layer 32R is in a range of 80 or more and 85 or less, that is, even though the ultrasound probe 100 is not placed in a high temperature environment in the manufacturing process.

Considering a material and a structure generally used as the acoustic matching portion 20, a Shore D hardness of the acoustic matching portion 20 is larger than 85.

Each of the first conductor layer 32F and the first conductor layer 32R is preferably formed of a heat-treated hardened silver paste from the viewpoint of conductive performance, ease of manufacture, and the like. As the heat-treated hardened silver paste, for example, a silver paste "LOCTITE ABLESTIK 2902" manufactured by LOCTITE Co., Ltd. can be preferably used, but the present invention is not limited to this. This silver paste has a Shore D hardness of 80 in a case in which a condition of performing firing at 65° C. for 2 hours is adopted as a firing condition for sufficiently obtaining conductivity.

[Manufacturing Process of Ultrasound Probe]

The ultrasound probe 100 described above is manufactured by sequentially performing the following first to seventh steps. Hereinafter, the manufacturing process of the ultrasound probe 100 will be described with reference to FIGS. 5 to 20. Hereinafter, an outline of each step will be described first, and then examples of each step will be described.

<First Step>
(Overview)

Figure 5:
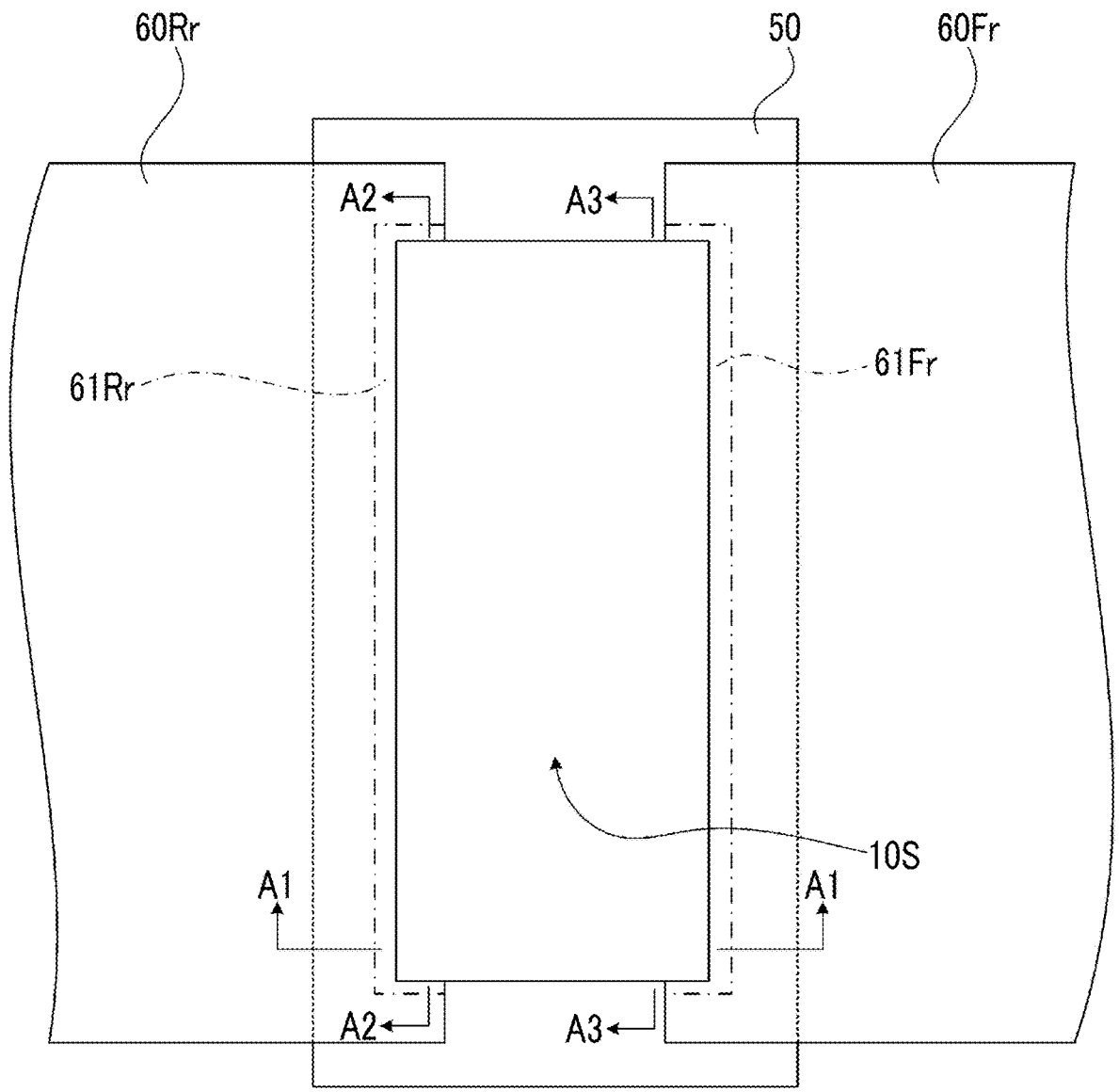
FIG. 5 is a schematic plan view showing a state after an end of a first step.
Figure 6:
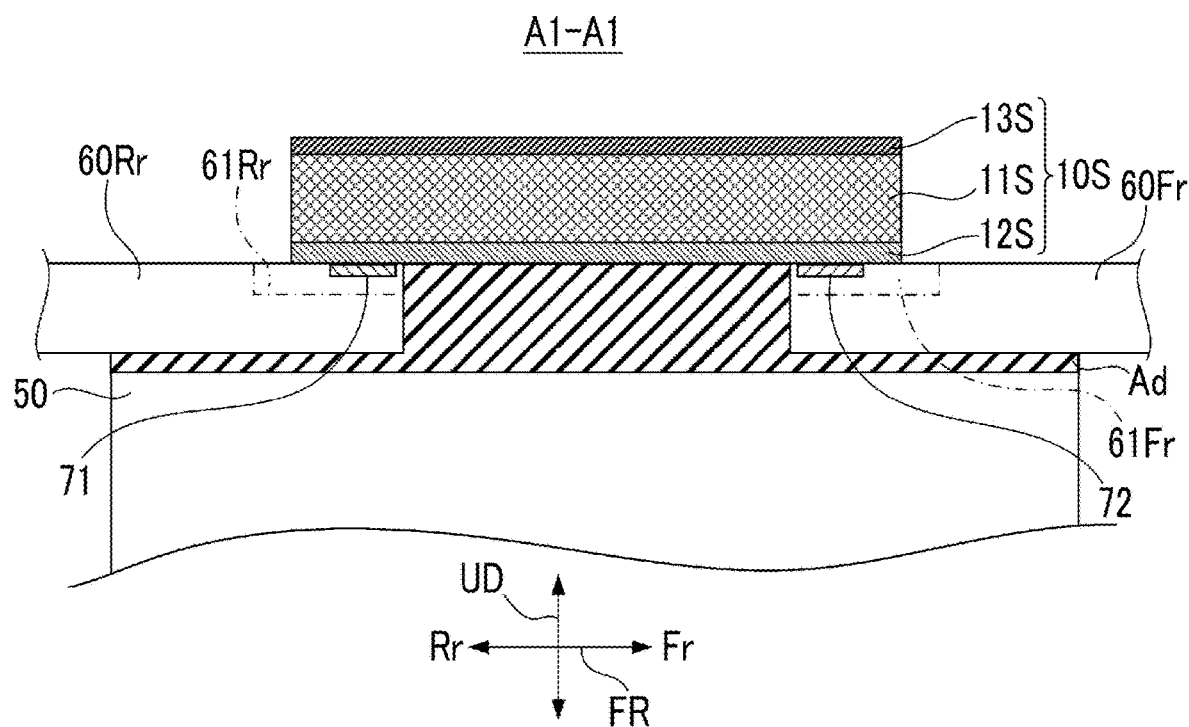
FIG. 6 is a schematic cross-sectional view taken along the line A1-A1 in FIG. 5.
Figure 7:
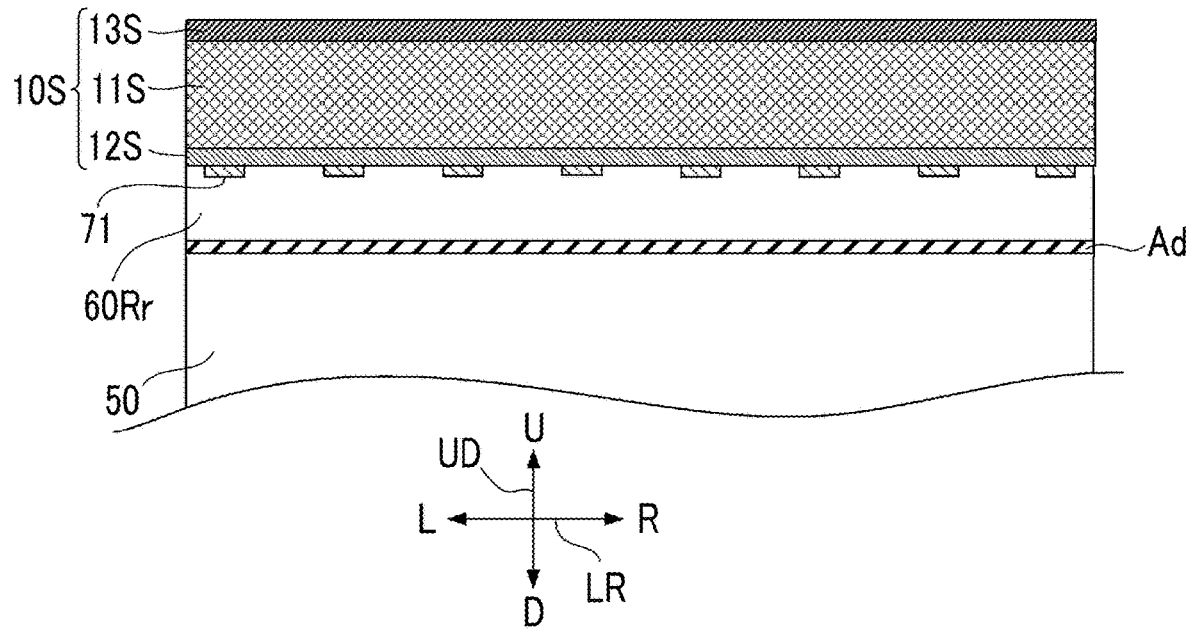
FIG. 7 is a schematic cross-sectional view taken along the line A2-A2 and the line A3-A3 in FIG. 5.
Figure 7:
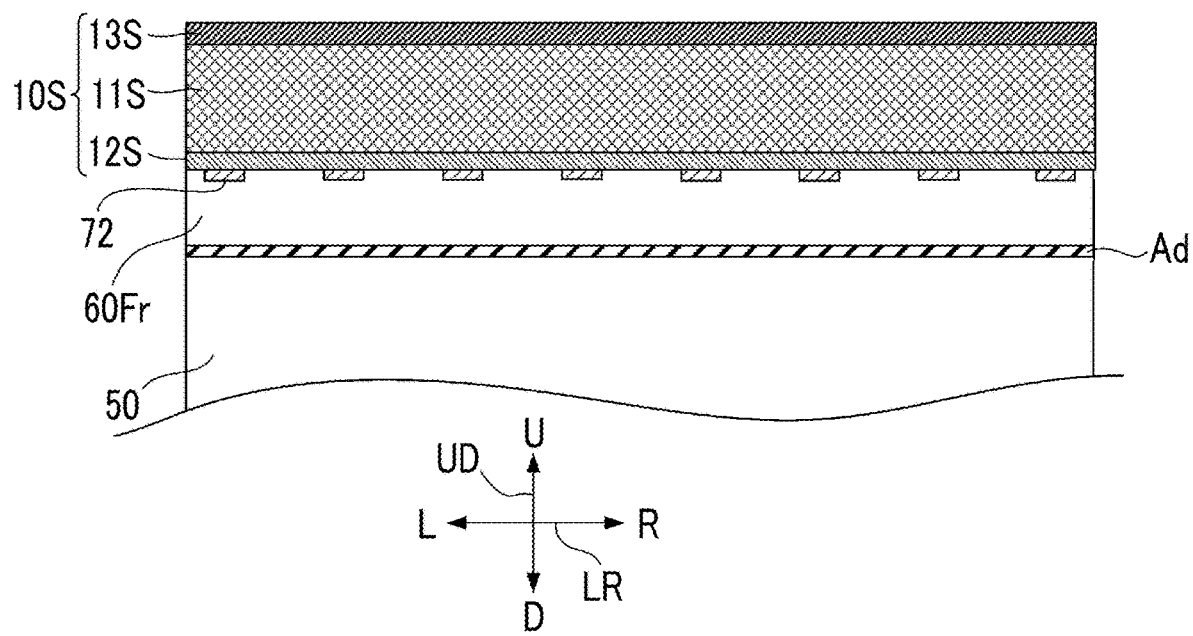

A sheet-like piezoelectric element 10S perpendicular to the up-down direction UD is formed, and the formed piezoelectric element 10S is bonded to the front FPC substrate 60Fr and the rear FPC substrate 60Rr with a conductive material. Further, a bonded body of the front FPC substrate 60Fr and the rear FPC substrate 60Rr and the piezoelectric element 10S is fixed to the backing material 50 with the adhesive Ad. FIG. 5 is a schematic plan view showing a state after an end of a first step. FIG. 6 is a schematic cross-sectional view taken along the line A1-A1 in FIG. 5. FIG. 7 is a schematic cross-sectional view taken along the line A2-A2 and the line A3-A3 in FIG. 5. The piezoelectric element 10S is a source of the plurality of piezoelectric elements 10, and is a laminate in which a first conductive portion 12S, a piezoelectric portion 11S, and a second conductive portion 13S are laminated, as shown in FIGS. 6 and 7.

Examples

"C91H" manufactured by Fuji Ceramics Co., Ltd. was used as the piezoelectric material, and this piezoelectric material was polished to have a thickness of 60 µm using a polishing sheet, to form the piezoelectric portion 11S in the piezoelectric element 10S. The first conductive portion 12S formed of a titanium film and a gold film was formed on one surface of the piezoelectric portion 11S by sputtering vapor deposition. The second conductive portion 13S formed of a titanium film and a gold film was formed on the other surface of the piezoelectric portion 11S by sputtering vapor deposition. The piezoelectric element 10S thus formed was trimmed to have a desired size using a dicing saw, and then subjected to ultrasonic cleaning and plasma cleaning, to complete the sheet-like piezoelectric element 10S.

In addition, each of the electrode pattern forming region 61Fr of the front FPC substrate 60Fr and the electrode pattern forming region 61Rr of the rear FPC substrate 60Rr was coated with a silver paste "LOCTITE ABLESTIK 2902" manufactured by LOCTITE Co., Ltd. using a dispenser. The piezoelectric element 10S was disposed on this silver paste in a state where the first conductive portion 12S is in contact with the silver paste, and the silver paste was hardened by heat treatment (at 65° C. for 2 hours), to bond the piezoelectric element 10S to the front FPC substrate 60Fr and the rear FPC substrate 60Rr.

<Second Step>
(Overview)

Figure 8:
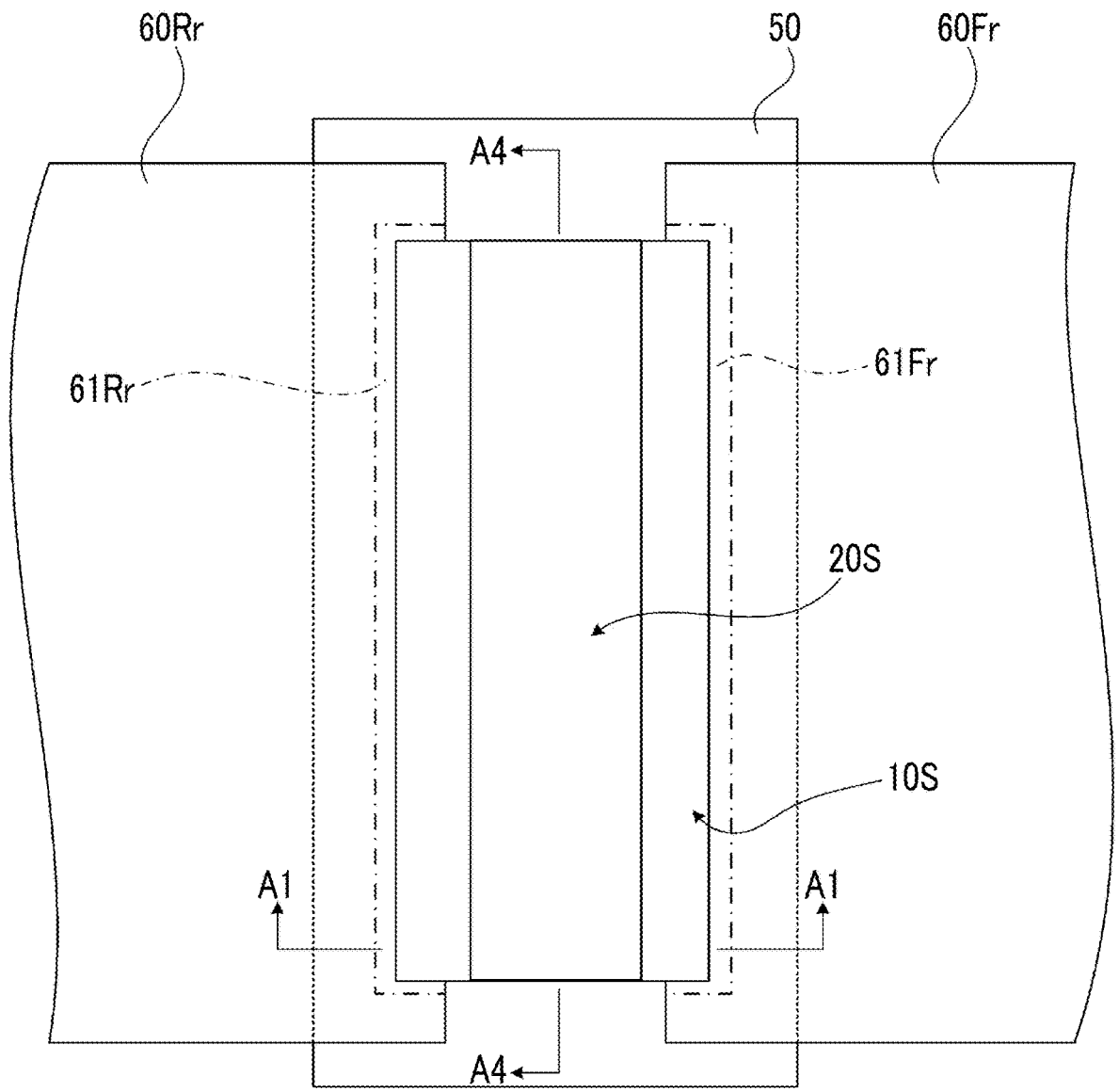
FIG. 8 is a schematic plan view showing a state after an end of a second step subsequent to the first step.
Figure 9:
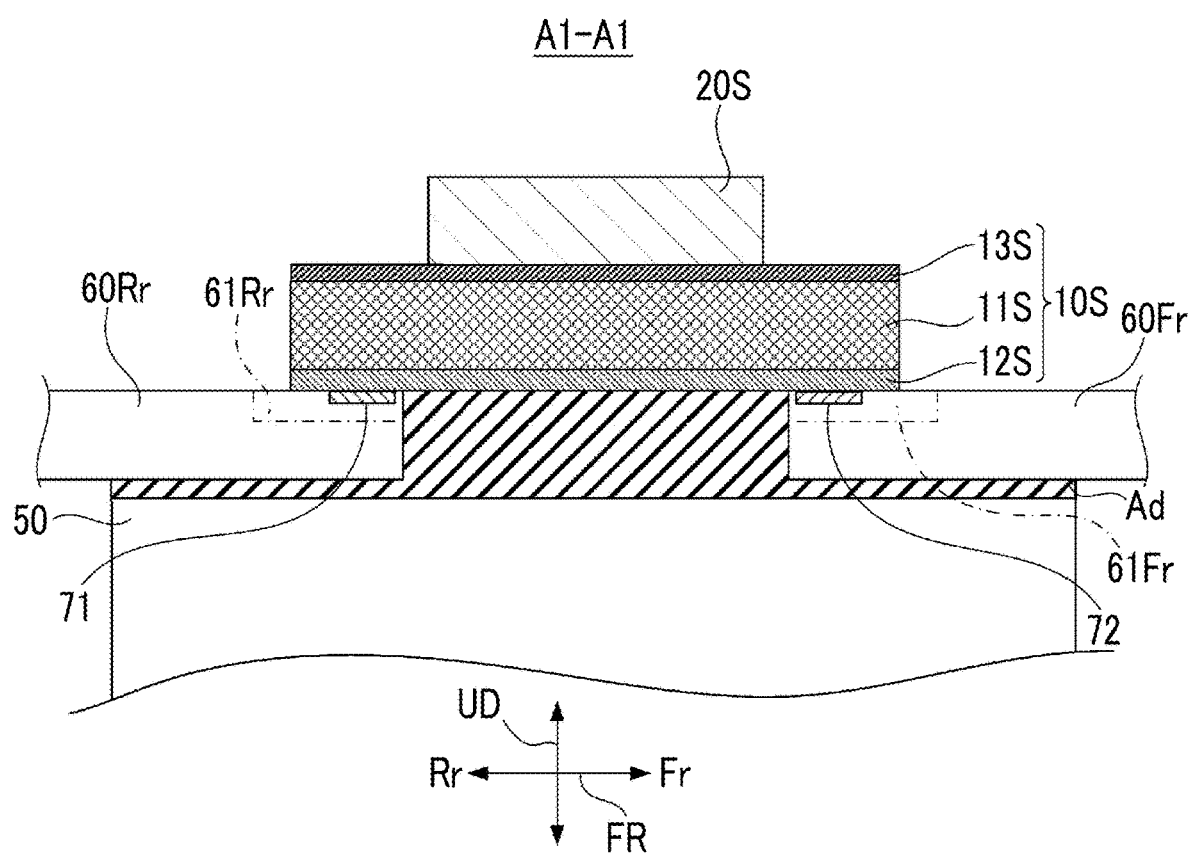
FIG. 9 is a schematic cross-sectional view taken along the line A1-A1 in FIG. 8.
Figure 10:
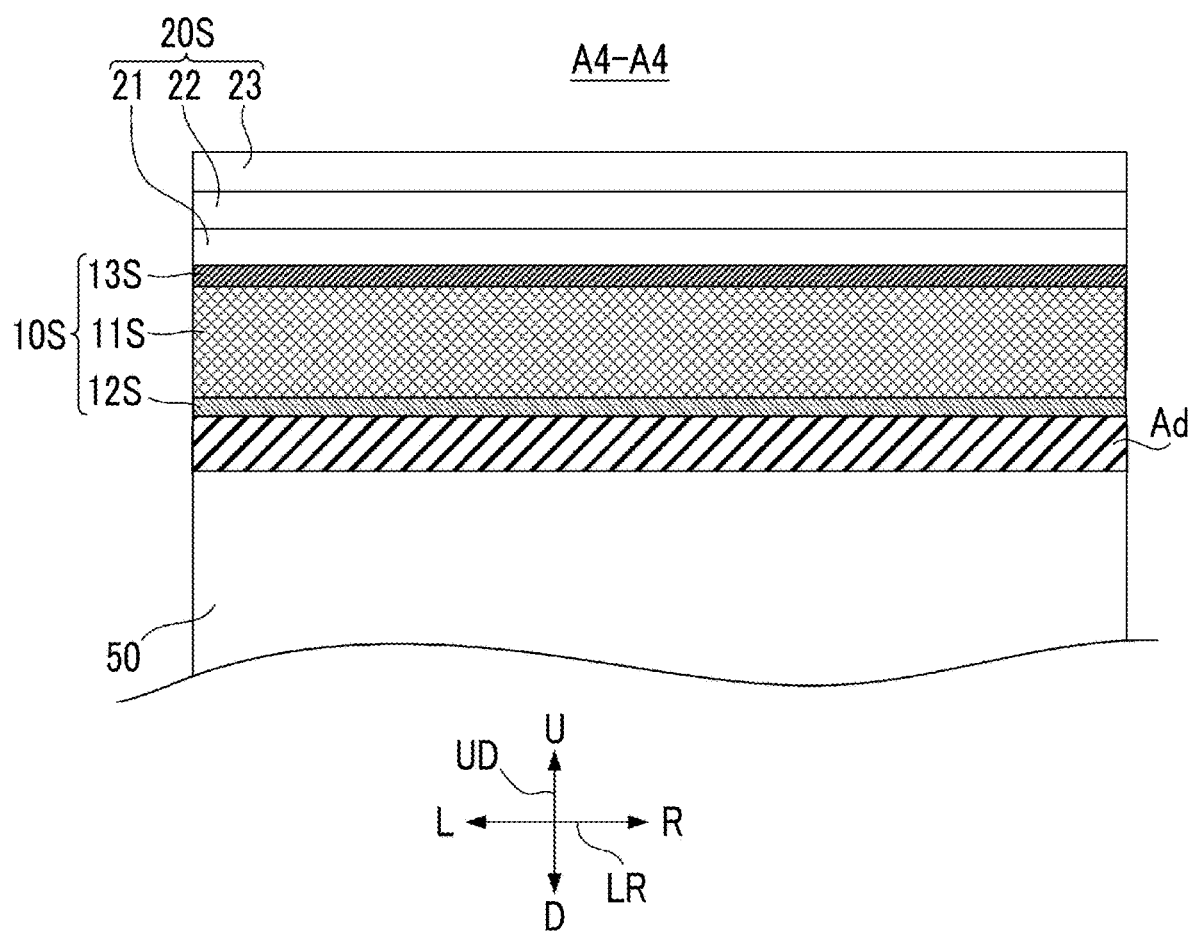
FIG. 10 is a schematic cross-sectional view taken along the line A4-A4 in FIG. 8.

As shown in FIG. 8, a sheet-like acoustic matching portion 20S perpendicular to the up-down direction UD is formed at a central portion of the front-rear direction FR on an upper surface of the piezoelectric element 10S shown in FIG. 5. FIG. 9 is a schematic cross-sectional view taken along the line A1-A1 in FIG. 8. FIG. 10 is a schematic cross-sectional view taken along the line A4-A4 in FIG. 8. In the example of FIG. 10, a case in which the acoustic matching portion 20S is a laminate of a first layer 21, a second layer 22, and a third layer 23 is shown.

Examples

The first layer 21 having a thickness of 25 µm was formed by a mixture of an epoxy resin "Epotek-330" manufactured by Epoxy Technology, Inc. and an iron powder having a particle size of 5 µm.

The second layer 22 having a thickness of 30 µm was formed by a mixture of an epoxy resin "Epotek-330" manufactured by Epoxy Technology, Inc. and an alumina powder having a particle size of 5 µm.

The third layer 23 having a thickness of 20 µm was formed by an epoxy resin "Epotek-330" manufactured by Epoxy Technology, Inc.

D.E.R. (registered trademark) 332 was applied as an epoxy resin onto the upper surface of the piezoelectric element 10S after the first step, the first layer 21 was disposed thereon, D.E.R. (registered trademark) 332 was applied onto the first layer 21, the second layer 22 was disposed thereon, D.E.R. (registered trademark) 332 was applied onto the second layer 22, and the third layer 23 was disposed thereon. After that, the obtained laminate was pressurized from the third layer 23 side to form the acoustic matching portion 20S having a three-layer structure and to adhere the acoustic matching portion 20S to the piezoelectric element 10S.

<Third Step>
(Overview)

Figure 11:
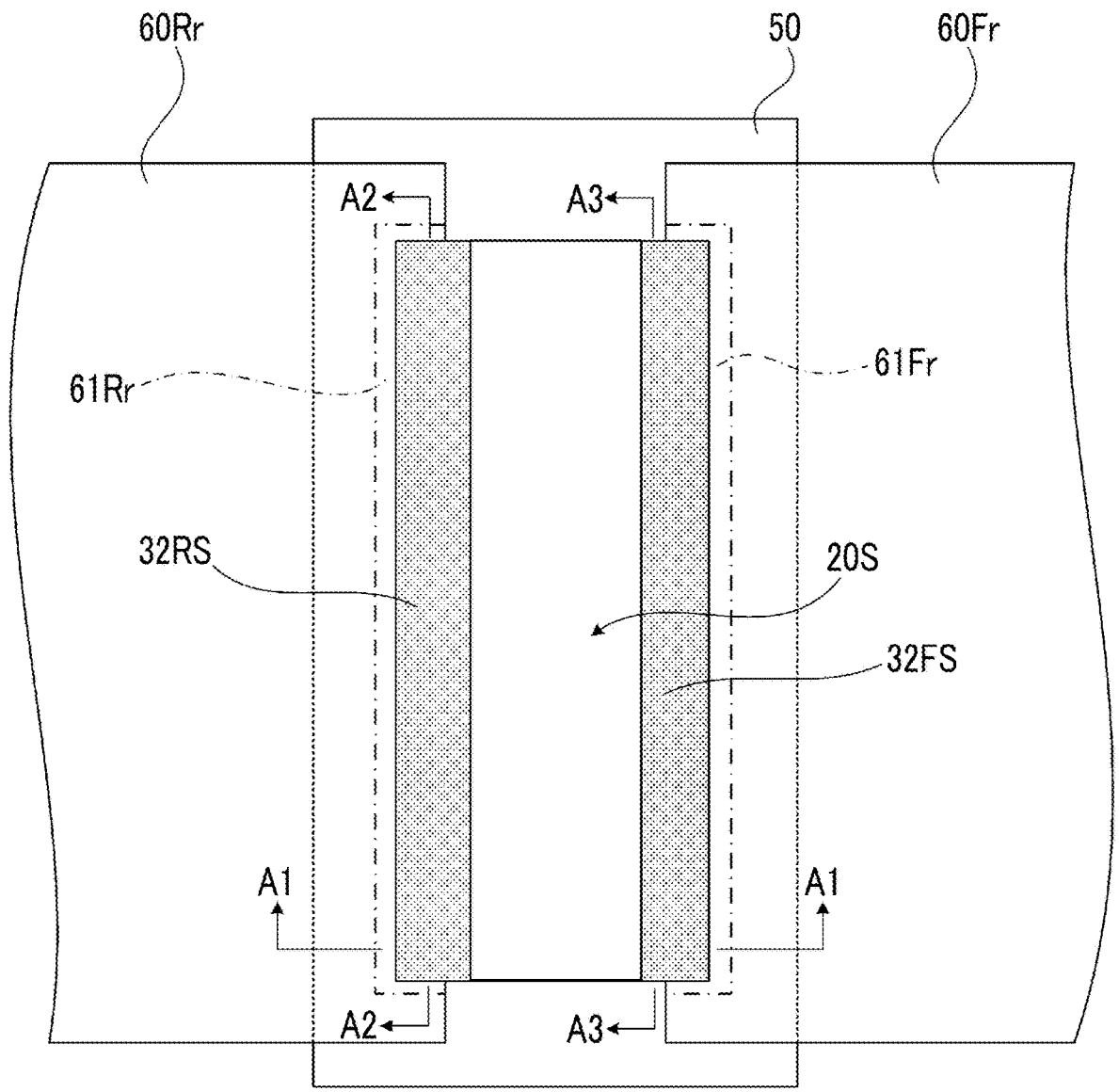
FIG. 11 is a schematic plan view showing a state after an end of a third step subsequent to the second step.
Figure 12:
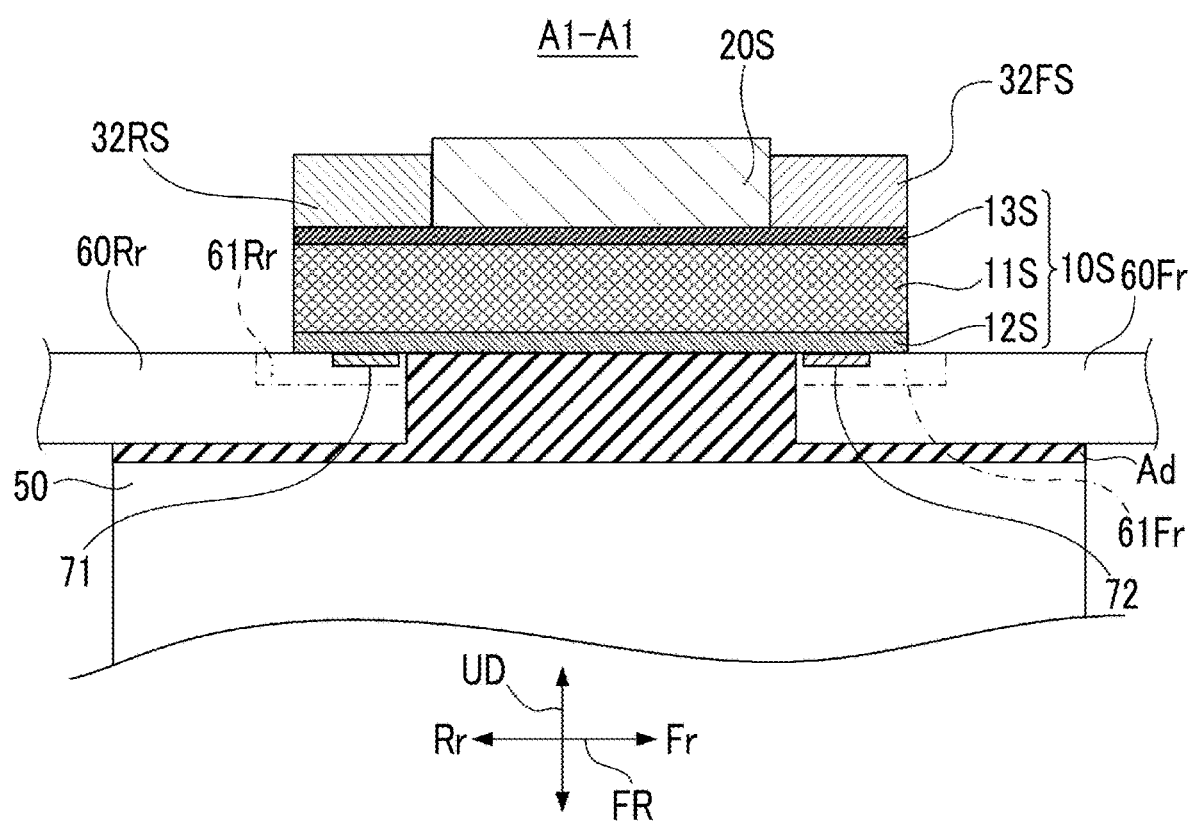
FIG. 12 is a schematic cross-sectional view taken along the line A1-A1 in FIG. 11.
Figure 13:
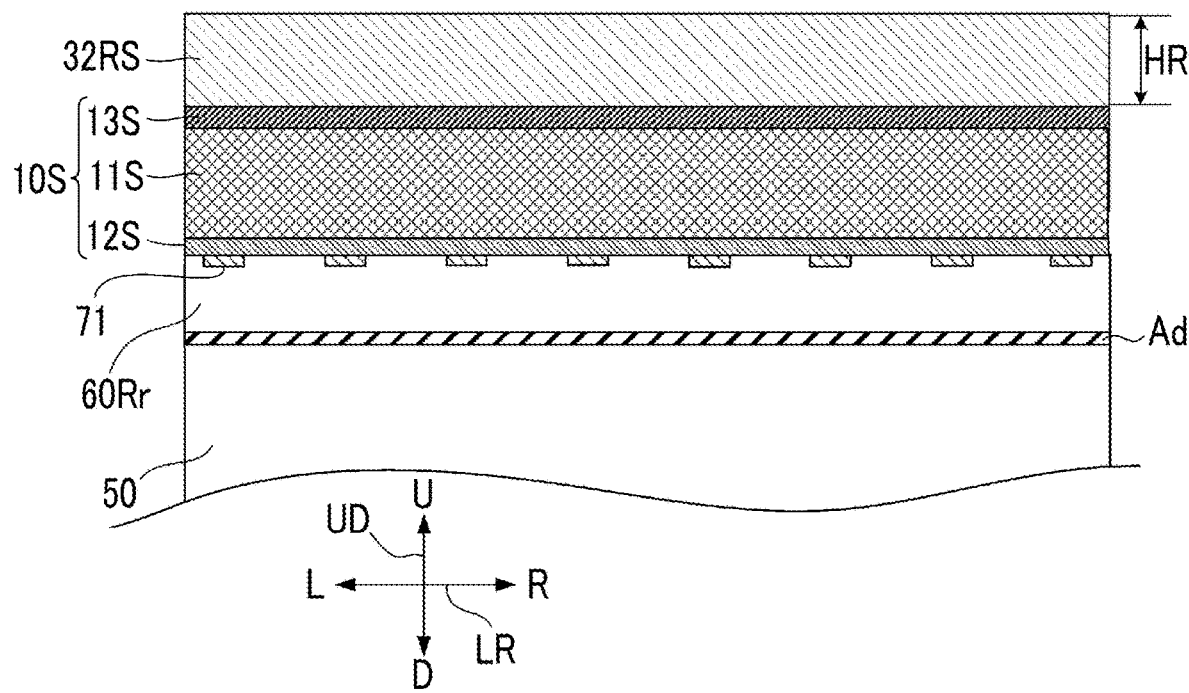
FIG. 13 is a schematic cross-sectional view taken along the line A2-A2 and the line A3-A3 in FIG. 11.
Figure 13:
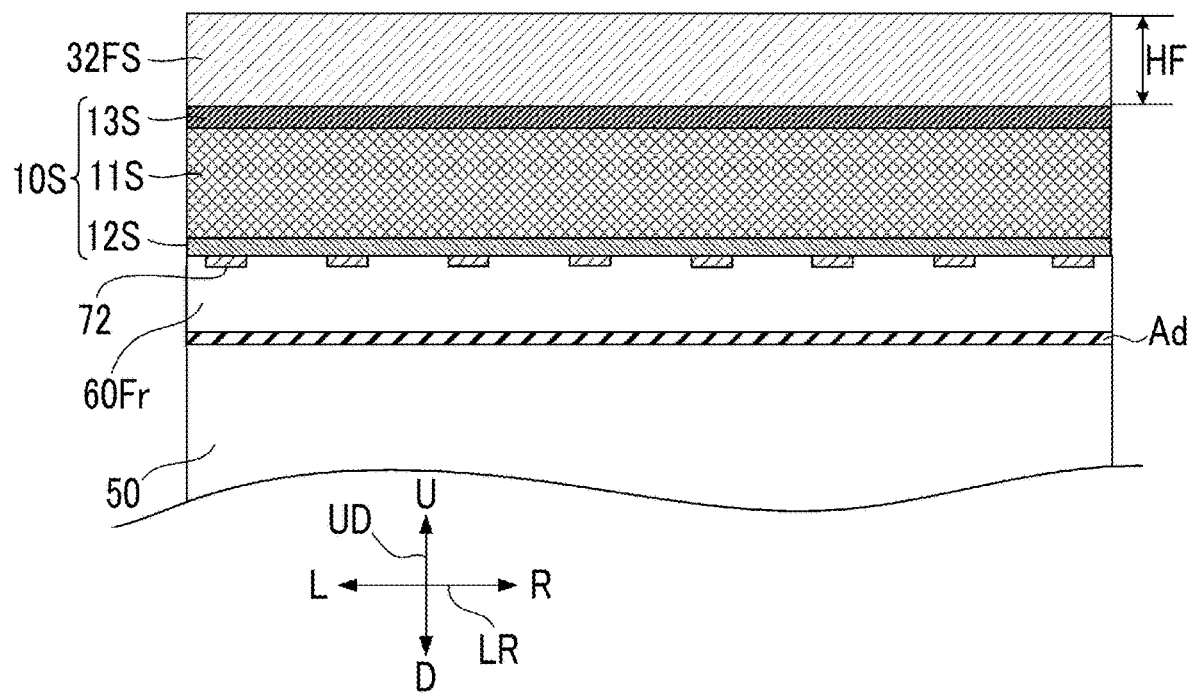

A conductive material is applied to an adjacent region on the front side of the acoustic matching portion 20S on the upper surface of the piezoelectric element 10S in the state shown in FIG. 8, and a conductive material is applied to an adjacent region on the rear side of the acoustic matching portion 20S on the upper surface of the piezoelectric element 10S shown in FIG. 8. These conductive materials are hardened by heat treatment to form a first conductor layer 32FS extending in the left-right direction LR and a first conductor layer 32RS extending in the left-right direction LR as shown in FIG. 11. FIG. 12 is a schematic cross-sectional view taken along the line A1-A1 in FIG. 11. FIG. 13 is a schematic cross-sectional view taken along the line A2-A2 and the line A3-A3 in FIG. 11.

In a third step, the first conductor layer 32RS is formed such that a thickness HR, which is a length in the up-down direction UD, of the first conductor layer 32RS shown in FIG. 13, is equal to or less than 1.6 times the above-described width D1 determined by a design value of the ultrasound probe 100. In addition, the first conductor layer 32FS is formed such that a thickness HF which is a length in the up-down direction UD, of the first conductor layer 32FS shown in FIG. 13, is equal to or less than 1.6 times the above-described width D1 determined by a design value of the ultrasound probe 100.

Examples

A silver paste "LOCTITE ABLESTIK 2902" manufactured by LOCTITE Co., Ltd. was applied to a region adjacent to the front side of the acoustic matching portion 20S in the piezoelectric element 10S after the second step using a dispenser.

A silver paste "LOCTITE ABLESTIK 2902" manufactured by LOCTITE Co., Ltd. was applied to a region adjacent to the rear side of the acoustic matching portion 20S in the piezoelectric element 10S after the second step using a dispenser.

After that, the silver pastes were hardened by heat treatment (at 65° C. for 2 hours) to form the first conductor layer 32FS and the first conductor layer 32RS.

<Fourth Step>
(Overview)

Figure 14:
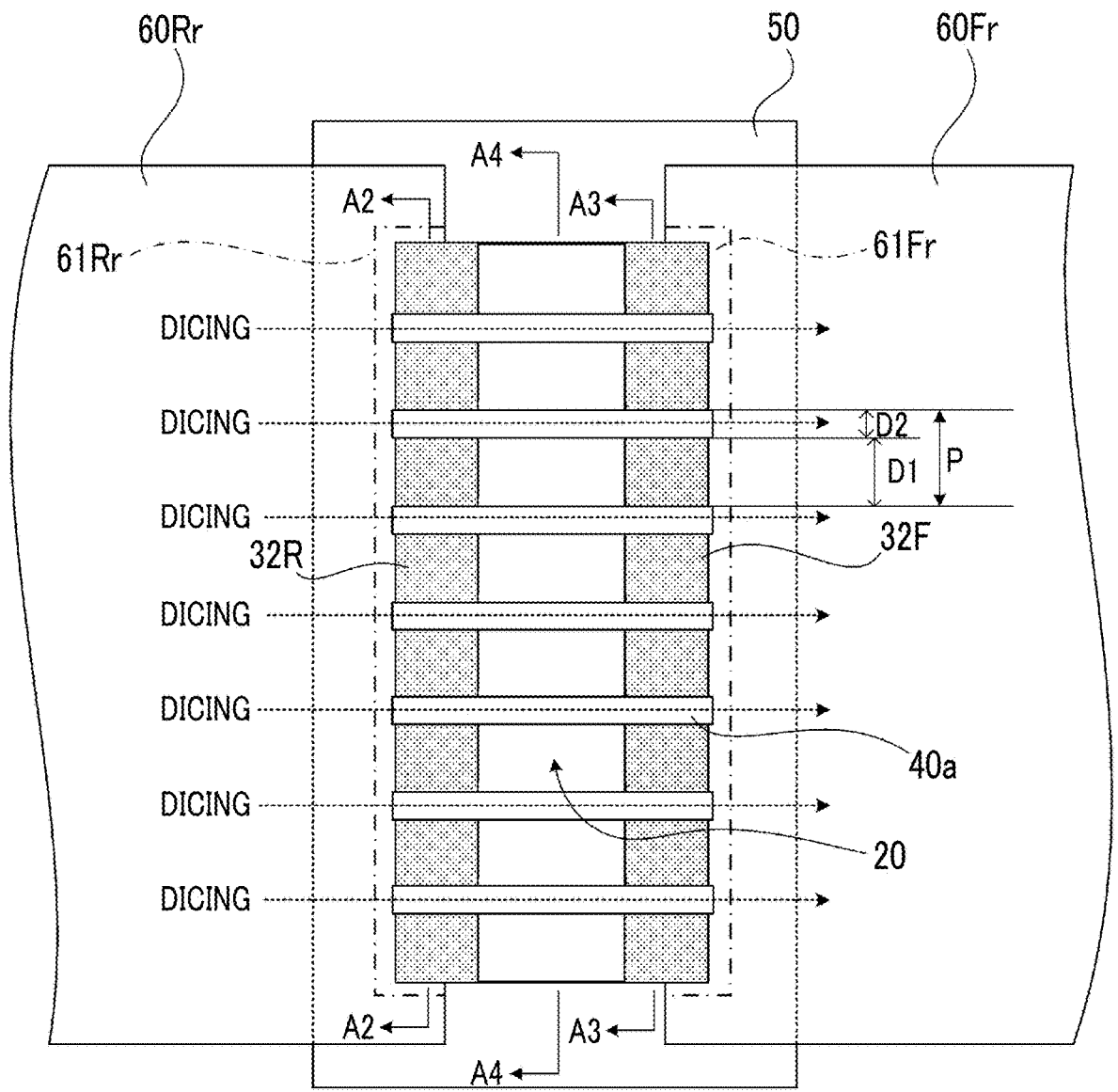
FIG. 14 is a schematic plan view showing a state after an end of a fourth step subsequent to the third step.

The piezoelectric element 10S having the acoustic matching portion 20S, the first conductor layer 32FS, and the first conductor layer 32RS formed on the upper surface by the third step is divided into a plurality of parts in the left-right direction LR by cutting, to form a plurality of the piezoelectric elements 10. FIG. 14 is a schematic plan view showing a state after an end of a fourth step. As shown in FIG. 14, the piezoelectric element 10S on which the acoustic matching portion 20S, the first conductor layer 32FS, and the first conductor layer 32RS are formed is cut by moving the dicing blade from the rear direction Rr to the front direction Fr. By repeating the cutting while changing a position of the LR in the left-right direction of the dicing blade, a state where a plurality of detection units having the width D1 are arranged in the left-right direction LR at the arrangement pitch P is obtained. A cutting region 40a shown in FIG. 14 indicates a region cut with the dicing blade.

Figure 15:
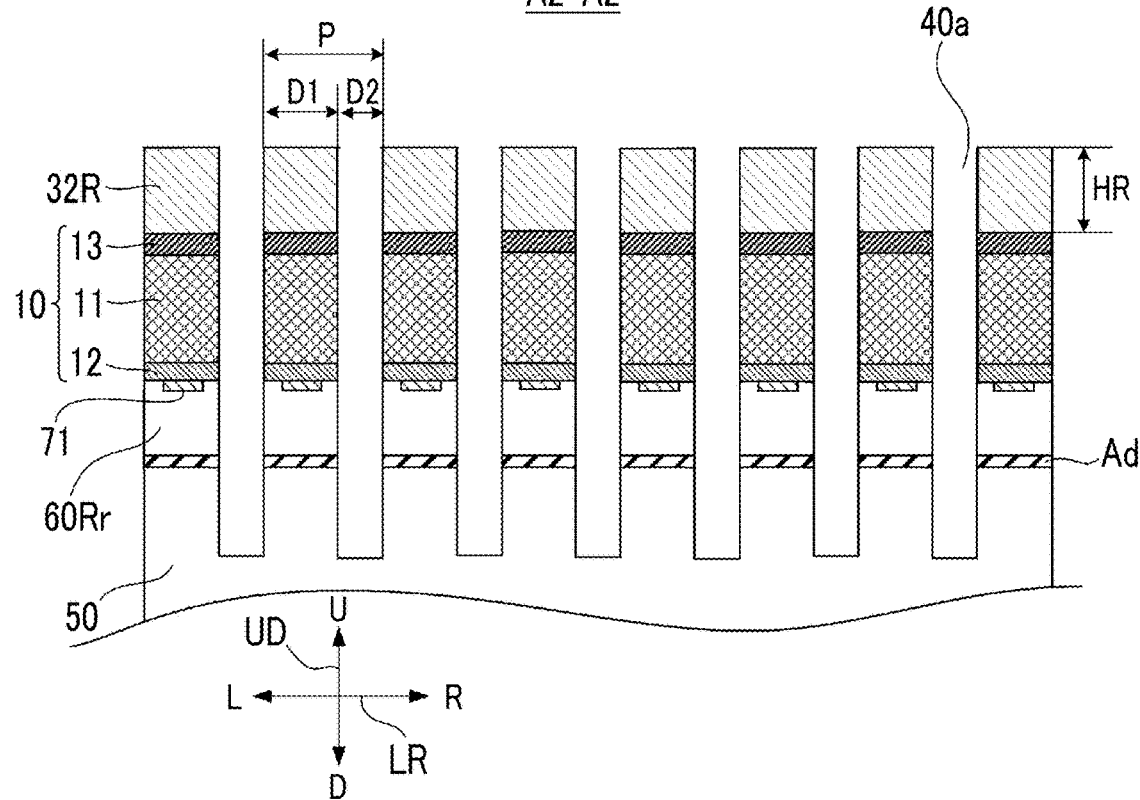
FIG. 15 is a schematic cross-sectional view taken along the line A2-A2 and the line A3-A3 in FIG. 14.
Figure 15:
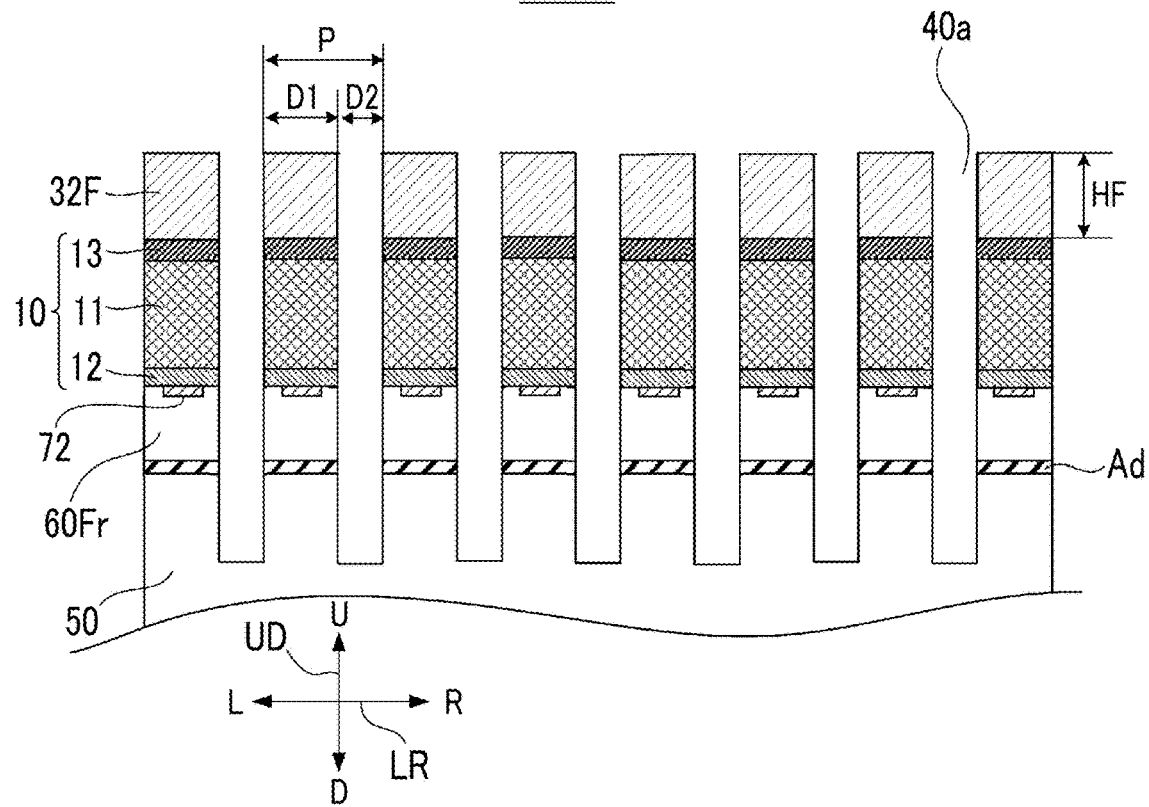
Figure 16:
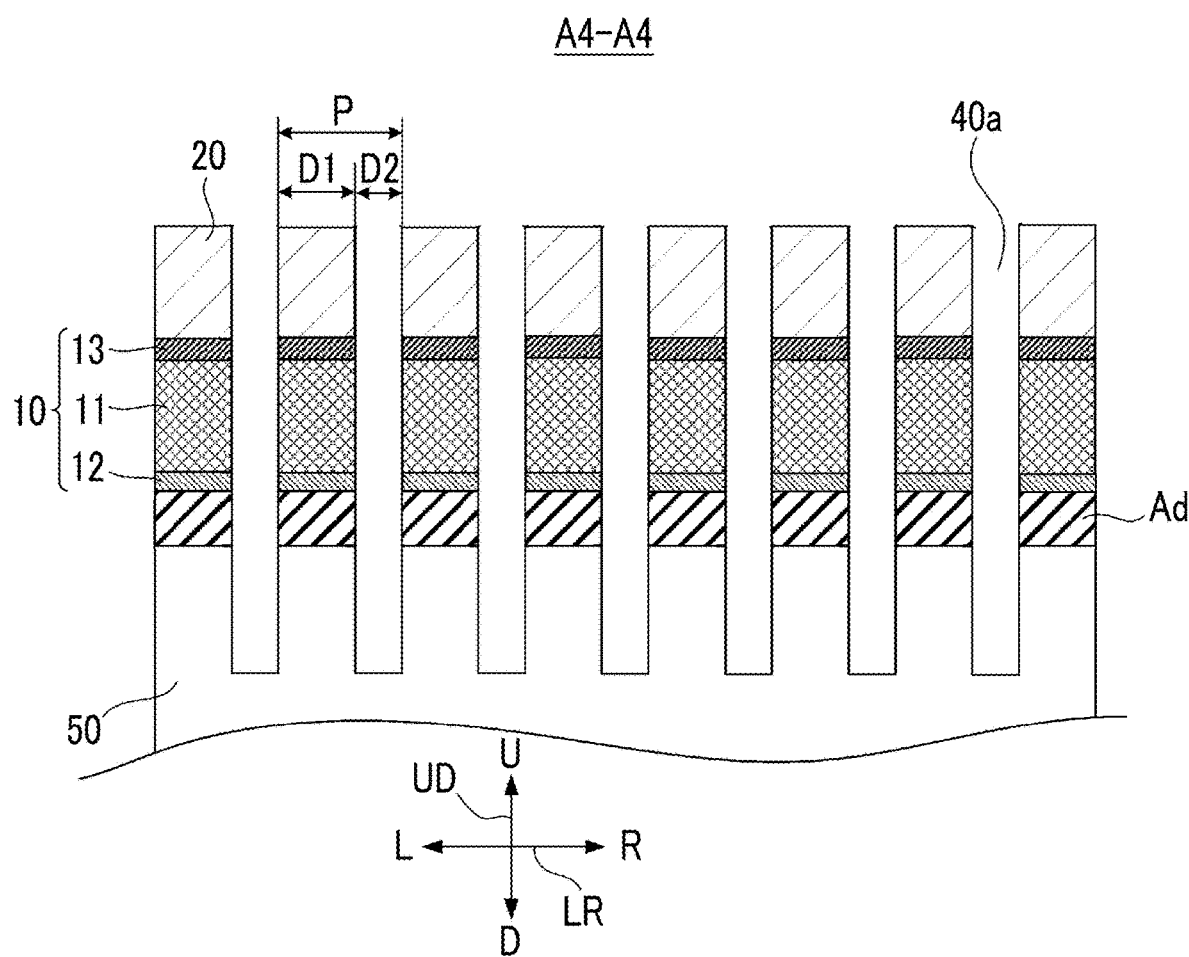
FIG. 16 is a schematic cross-sectional view taken along the line A4-A4 in FIG. 14.

FIG. 15 is a schematic cross-sectional view taken along the line A2-A2 and the line A3-A3 in FIG. 14. FIG. 16 is a schematic cross-sectional view taken along the line A4-A4 in FIG. 14. As shown in FIGS. 15 and 16, the cutting region 40a reaches the backing material 50. Accordingly, the electrical separation between the plurality of line electrodes 71 and the electrical separation between the plurality of line electrodes 72 are also performed.

Examples

The piezoelectric element 10S having the acoustic matching portion 20S, the first conductor layer 32FS, and the first conductor layer 32RS formed on the upper surface by the third step was divided into a plurality of parts in the left-right direction LR by cutting, to form 256 piezoelectric elements 10. Dicing conditions were as follows.

Dicing Conditions:
- Pitch (arrangement pitch P in FIG. 14): 40 μm
- Number of times of cutting: 280
- Feed speed: 1.5 mm/sec
- Rotation speed: 30,000 rpm Dicing Blade:
- Width of 15 μm
- Z09-SD2500-Y1-60  51.0×0.015  (manufactured by DISCO Corporation)

Dicing Saw:
- DAD 323 (manufactured by DISCO Corporation)

Since the first conductor layer 32FS and the first conductor layer 32RS have a low Shore D hardness, it is possible to reduce a load applied to the dicing blade during dicing, and to extend a life of the dicing blade. In addition, the soft first conductor layer 32FS and first conductor layer 32RS can be used to prevent chipping during dicing.

<Fifth Step>
(Overview)

Figure 17:
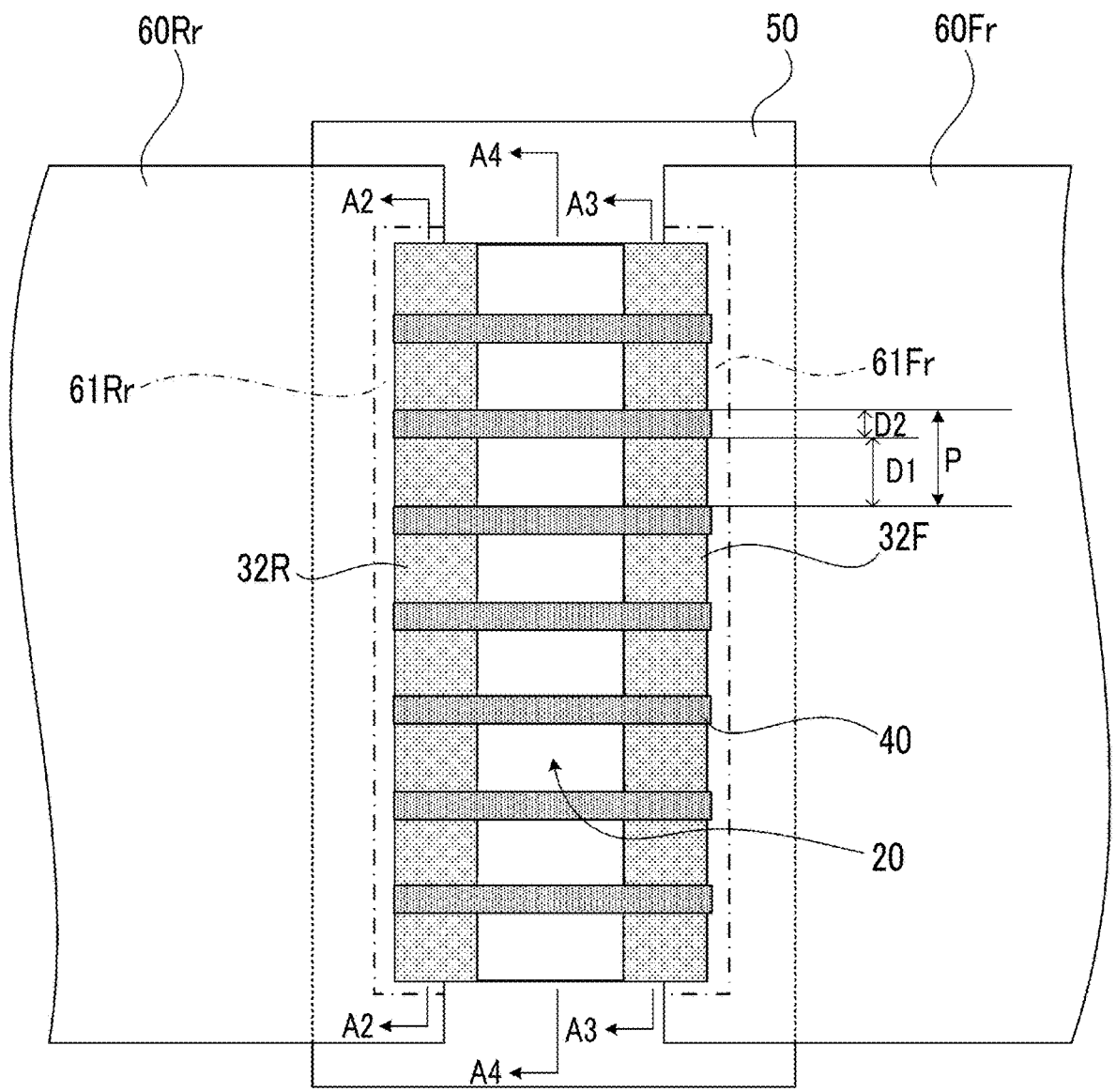
FIG. 17 is a schematic plan view showing a state after an end of a fifth step subsequent to the fourth step.
Figure 18:
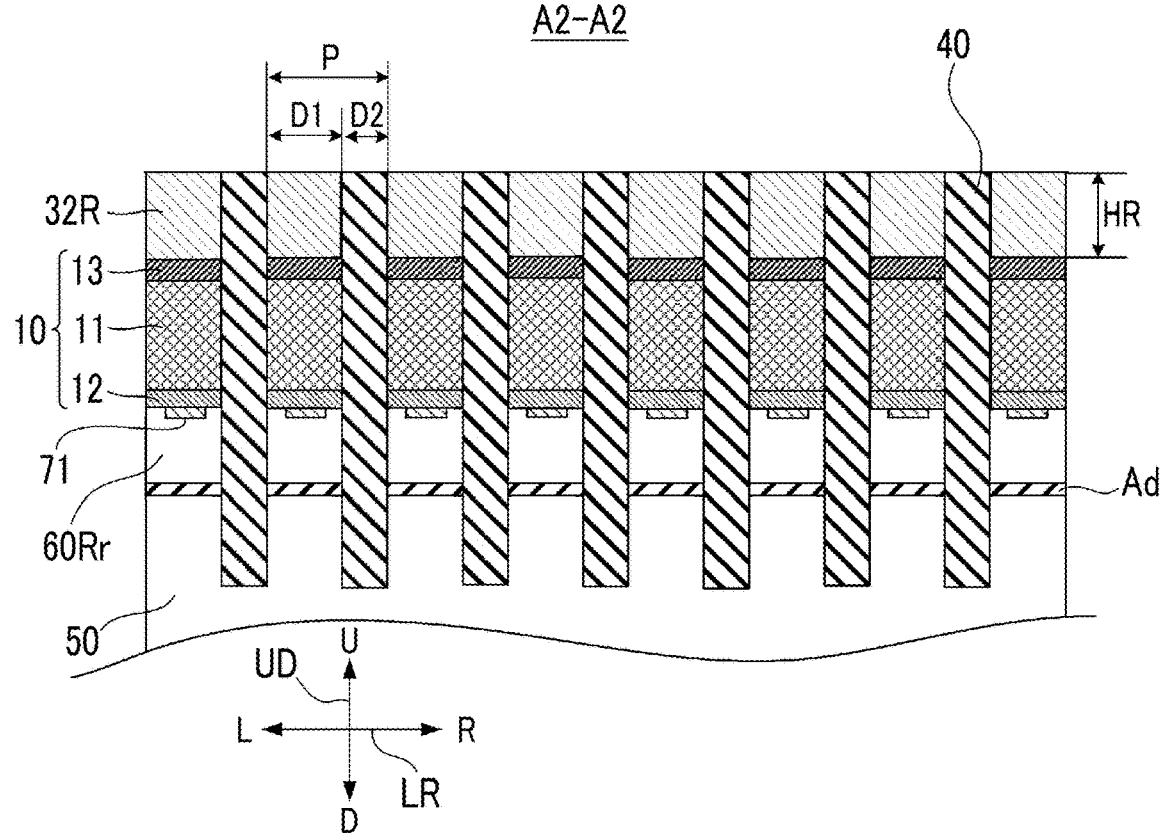
FIG. 18 is a schematic cross-sectional view taken along the line A2-A2 and the line A3-A3 in FIG. 17.
Figure 18:
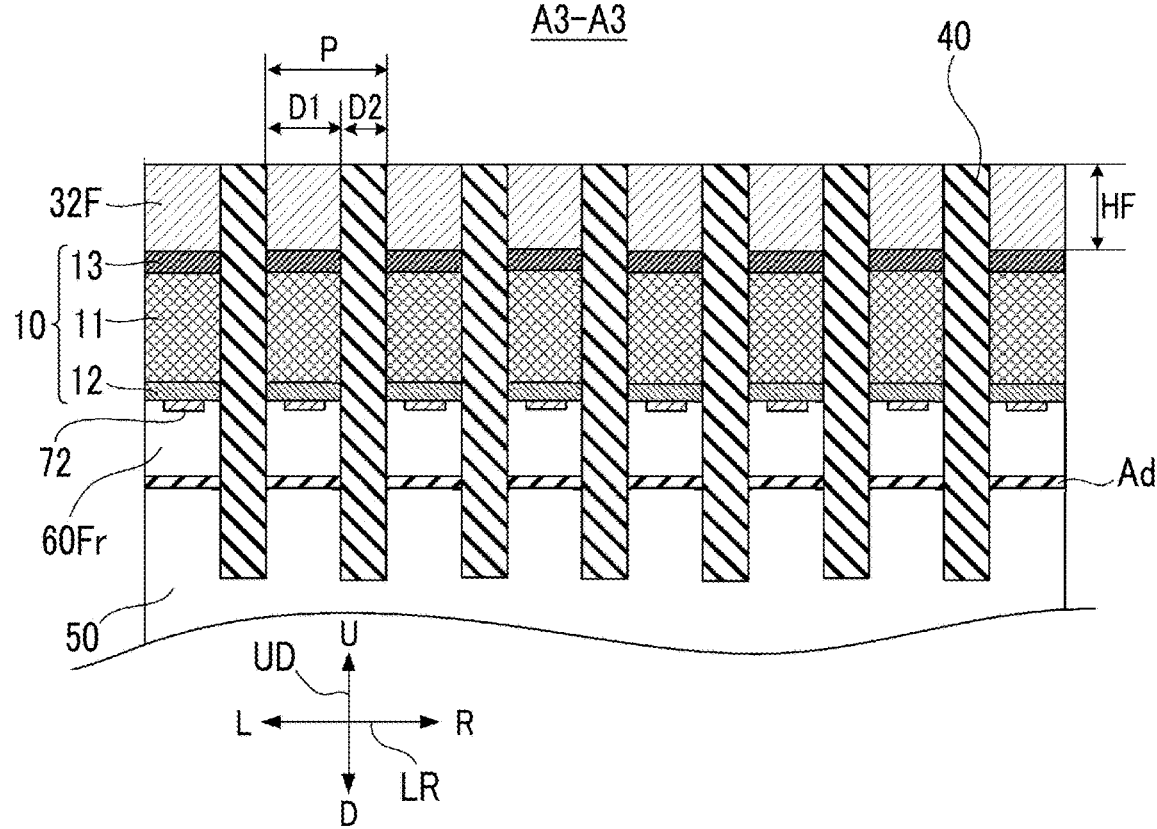
Figure 19:
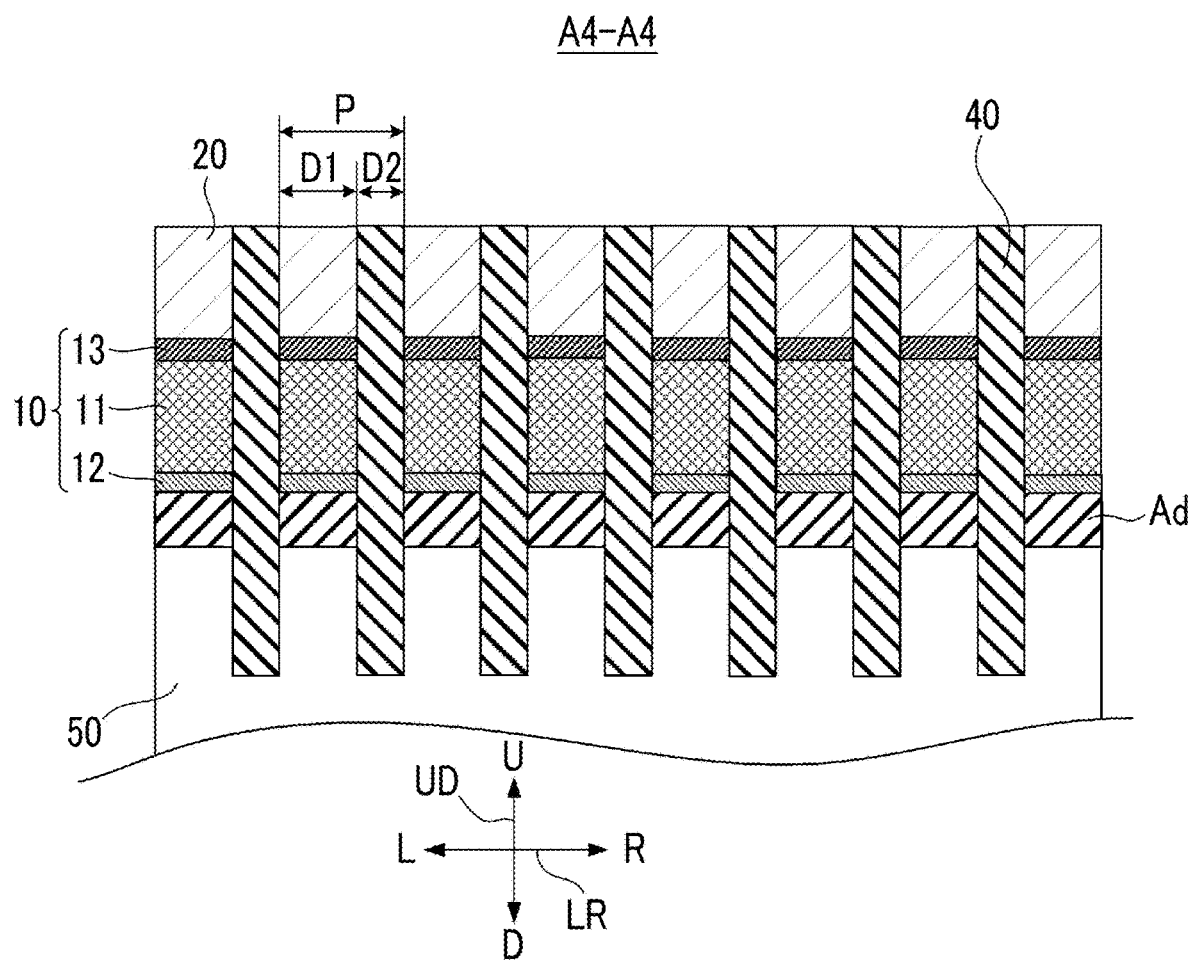
FIG. 19 is a schematic cross-sectional view taken along the line A4-A4 in FIG. 17.

The cutting region 40a formed in the fourth step is filled with the insulating filling material 40. FIG. 17 is a schematic plan view showing a state after an end of a fifth step. FIG. 18 is a schematic cross-sectional view taken along the line A2-A2 and the line A3-A3 in FIG. 17. FIG. 19 is a schematic cross-sectional view taken along the line A4-A4 in FIG. 17.

Examples

The cutting region 40a formed in the fourth step was filled with a silicone resin "RTV630" manufactured by Momentive. By evacuating an inside of a vacuum chamber using a rotary pump for about 10 minutes, filling was performed such that there were no air bubbles inside the cutting region 40a.

<Sixth Step>
(Overview)

Upper surfaces of the first conductor layer 32F and the first conductor layer 32R in FIG. 17 are activated. By cutting the upper surfaces of a plurality of the first conductor layers 32F arranged in the left-right direction LR and the insulating filling materials 40 between the plurality of first conductor layers 32F with a dicing blade, the upper surfaces of the plurality of first conductor layers 32F are activated. Similarly, by cutting the upper surfaces of a plurality of the first conductor layers 32R arranged in the left-right direction LR and the insulating filling materials 40 between the plurality of first conductor layers 32R by a dicing blade, the upper surfaces of the plurality of first conductor layers 32R are activated.

In a sixth step, the upper surfaces of the first conductor layer 32F and the first conductor layer 32R are extremely slightly scraped to such an extent that the thicknesses (thickness HR and thickness HF shown in FIG. 15) in the up-down direction UD of the first conductor layer 32F and the first conductor layer 32R do not substantially change. That is, even after an end of the sixth step, the thicknesses of the first conductor layer 32F and the first conductor layer 32R are substantially the same as a state after an end of the third step (thicknesses equal to or less than 1.6 times the width D1). In addition, this sixth step is not essential and may be omitted.

Examples

The upper surfaces of the first conductor layer 32F and the first conductor layer 32R after the fifth step were cut with the dicing saw used in the fourth step, and were activated.

<Seventh Step>
(Overview)

Figure 20:
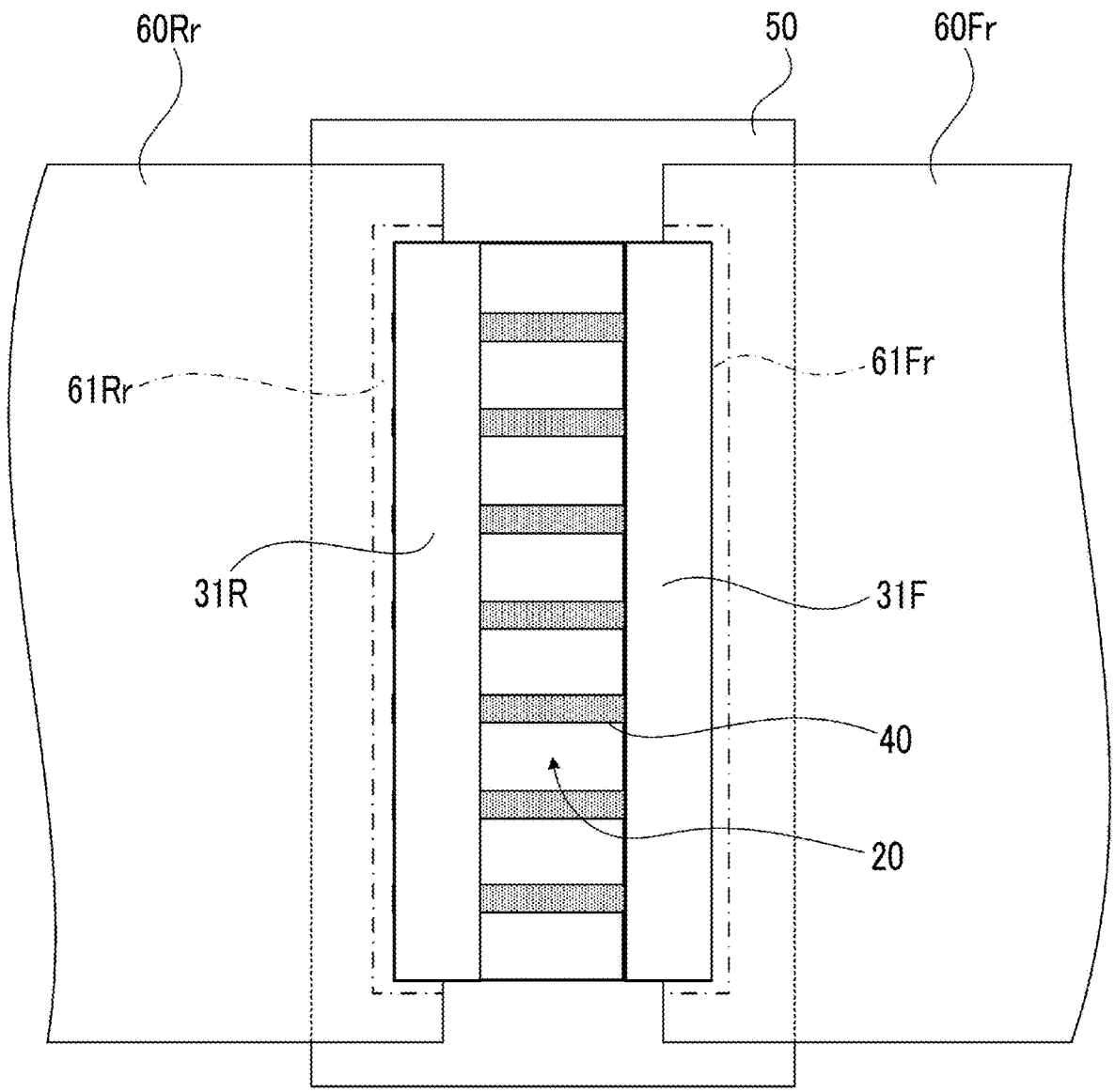
FIG. 20 is a schematic plan view showing a state after an end of a seventh step, which is performed after the fifth step.

As shown in FIG. 20, on the activated upper surfaces of the plurality of first conductor layers 32F, the second conductor layer 31F extending over the plurality of first conductor layers 32F is formed. In addition, on the activated upper surfaces of the plurality of first conductor layers 32R, the second conductor layer 31R extending over the plurality of first conductor layers 32R is formed.

Examples

A silver paste "LOCTITE ABLESTIK 2902" manufactured by LOCTITE Co., Ltd. was applied onto the activated upper surfaces of the plurality of first conductor layers 32F.

A silver paste "LOCTITE ABLESTIK 2902" manufactured by LOCTITE Co., Ltd. was applied onto the activated upper surfaces of the plurality of first conductor layers 32R.

After that, the silver paste was hardened by heat treatment (at 65° C. for 2 hours) to form the second conductor layer 31F and the second conductor layer 31R.

After that, upper surfaces of the second conductor layer 31F and the second conductor layer 31R were cut with the dicing saw used in the fourth step such that the upper surfaces of the second conductor layer 31F and the second conductor layer 31R were flush with the upper surface of the acoustic matching portion 20.

First Modification Example

Figure 21:
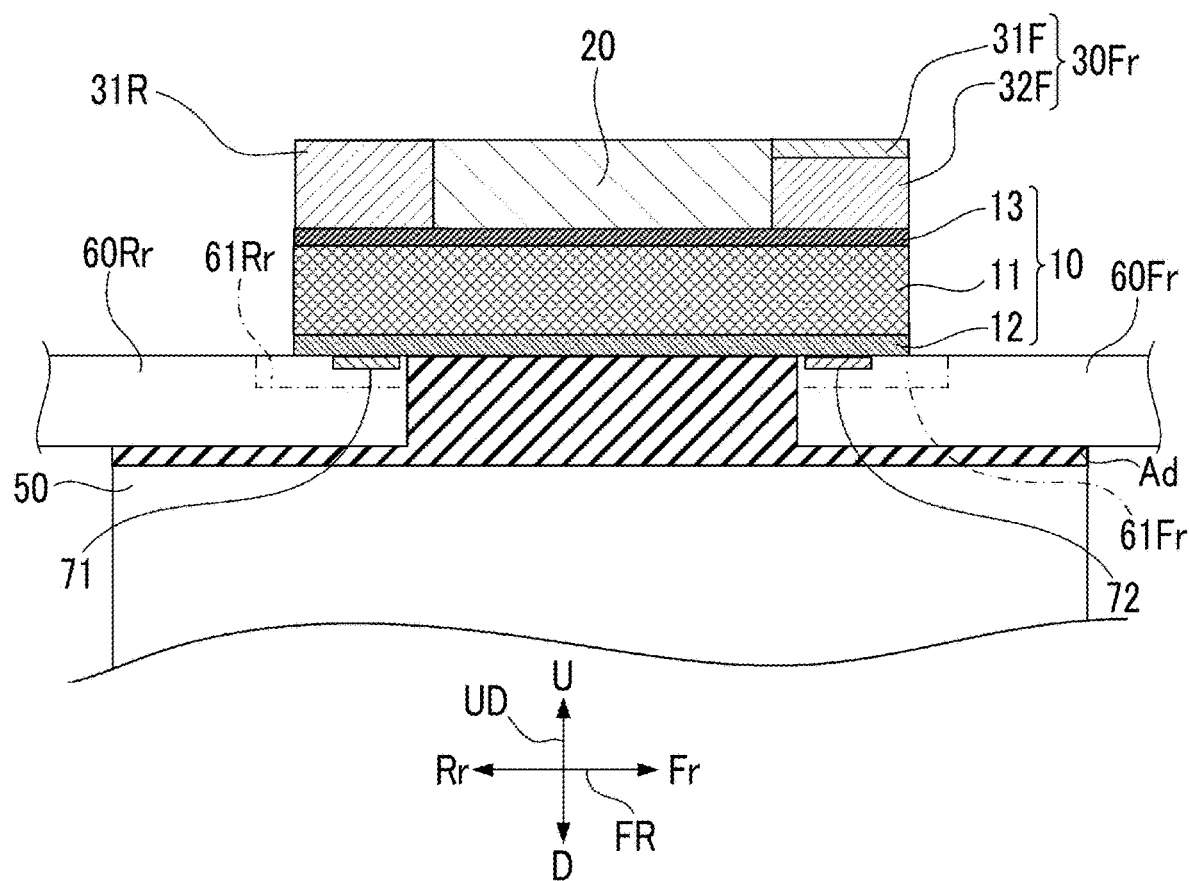
FIG. 21 is a view showing a first modification example of the ultrasound probe 100, and is a schematic cross-sectional view corresponding to a cross section taken along the line A-A FIG. 1.

FIG. 21 is a view showing a first modification example of the ultrasound probe 100, and is a schematic cross-sectional view corresponding to a cross section taken along the line A-A FIG. 1. A configuration of the modification example shown in FIG. 21 is the same as that in FIG. 2 except that the first conductor layer 32R is removed from the conductive member 30Rr having a multi-layer structure, and only the second conductor layer 31R is formed on the rear side of the acoustic matching portion 20. In a case of manufacturing the ultrasound probe of the modification example shown in FIG. 21, the fourth step (FIG. 14) and the fifth step (FIG. 17) need only be performed without forming the first conductor layer 32RS in the third step (FIG. 11), and then the second conductor layer 31R need only be formed on the rear side of the acoustic matching portion 20 by extending over the plurality of piezoelectric elements 10 in the seventh step.

Second Modification Example

Figure 22:
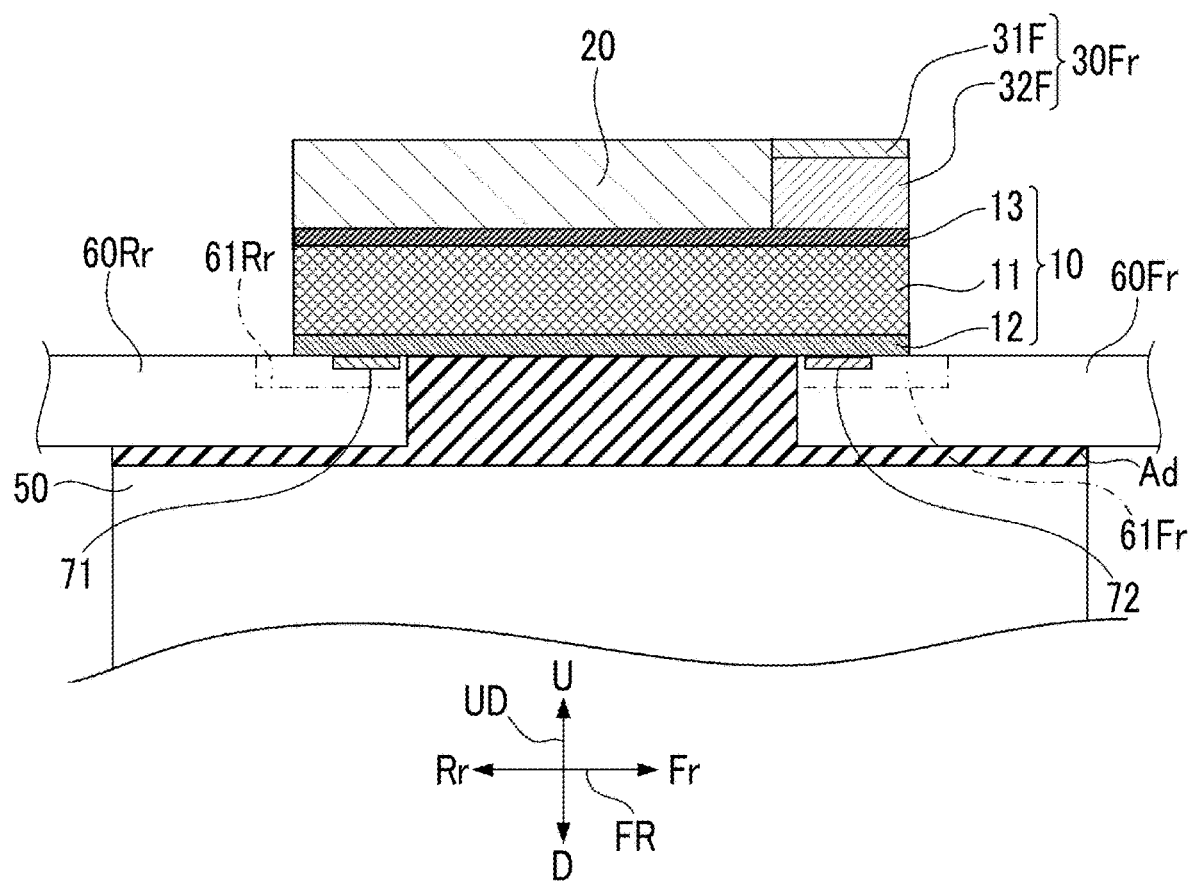
FIG. 22 is a view showing a second modification example of the ultrasound probe 100, and is a schematic cross-sectional view corresponding to a cross section taken along the line A-A FIG. 1.

FIG. 22 is a view showing a second modification example of the ultrasound probe 100, and is a schematic cross-sectional view corresponding to a cross section taken along the line A-A FIG. 1. A configuration of the modification example shown in FIG. 22 is the same as that in FIG. 2 except that the conductive member 30Rr having a multi-layer structure is removed, and the acoustic matching portion 20 is formed up to a region where the conductive member 30Rr having a multi-layer structure was formed. In a case of manufacturing the ultrasound probe of the modification example shown in FIG. 22, the acoustic matching portion 20S need only be formed up to a region where the first conductor layer 32RS was formed in the second step (FIG. 8), then only the first conductor layer 32FS need only be formed in the third step (FIG. 11), then the fourth step (FIG. 14) and the fifth step (FIG. 17) need only be performed, and then the second conductor layer 31F need only be formed on the front side of the acoustic matching portion 20 in the seventh step.

[Verification Result]

FIG. 23 is a diagram showing verification results of the ultrasound probe prepared according to the examples of the manufacturing process described above. Hereinafter, the contents of Examples 1 to 4, Reference Examples 1 and 2, and Comparative Examples 1 and 2 shown in FIG. 23 will be described.

Example 1

An ultrasound probe corresponding to the drive of 23 MHz having the configurations shown in FIGS. 1 to 4 was prepared. The total number of the piezoelectric elements 10 was set to 256, and the width D1 of the piezoelectric element 10 was set to 25 µm. The ratio (HR/D1) of the first conductor layer 32R formed in the third step was set to 0.4, and the ratio (HF/D1) of the first conductor layer 32F formed in the third step was set to 0.4.

Example 2

An ultrasound probe was prepared in the same manner as in Example 1 except that the ratio (HF/D1) of the first conductor layer 32F formed in the third step was changed to 1.4.

Example 3

An ultrasound probe having the configuration of the modification example shown in FIG. 22 was prepared. The total number of the piezoelectric elements 10 was set to 256, and the width D1 of the piezoelectric element 10 was set to 25 µm. The ratio (HF/D1) of the first conductor layer 32F formed in the third step was set to 1.4.

Example 4

An ultrasound probe was prepared in the same manner as in Example 1 except that the ratio (HF/D1) of the first conductor layer 32F formed in the third step was changed to 1.6.

Reference Example 1

An ultrasound probe was prepared in the same manner as in Example 1 except that the width D1 of the piezoelectric element 10 was changed to 40 µm, the ratio (HR/D1) of the first conductor layer 32R formed in the third step was changed to 2.6, and the ratio (HF/D1) of the first conductor layer 32F formed in the third step was changed to 2.6.

Reference Example 2

An ultrasound probe was prepared in the same manner as in Example 1 except that the width D1 of the piezoelectric element 10 was changed to 63 µm, the ratio (HR/D1) of the first conductor layer 32R formed in the third step was changed to 2.3, and the ratio (HF/D1) of the first conductor layer 32F formed in the third step was changed to 2.3.

Comparative Example 1

An ultrasound probe was prepared in the same manner as in Example 1 except that the ratio (HF/D1) of the first conductor layer 32F formed in the third step was changed to 1.8.

Comparative Example 2

An ultrasound probe was prepared in the same manner as in Example 1 except that the ratio (HF/D1) of the first conductor layer 32F formed in the third step was changed to 1.7.

The term "tilt fall rate" shown in FIG. 23 indicates a percentage of detection units that have fallen or have been tilted in the left-right direction in 256 detection units. The term "OK" in the evaluation shown in FIG. 23 indicates that the ultrasound probe is a good product with no falling or tilting of the detection unit and no performance problem. The term "NG" in the evaluation shown in FIG. 23 indicates that the ultrasound probe cannot be used as a product because the falling or tilting of the detection unit occurs.

As can be seen by comparing Examples 1 to 4 with Comparative Examples 1 and 2, in a case in which the ratio (HF/D1) exceeds 1.6, the falling or tilting occurs. In addition, as shown in the results of Example 1, in a case in which the ratio (HR/D1) and the ratio (HF/D1) were set to 0.4, the falling or tilting does not occur, so that it can be seen that the cause of the falling or tilting in Comparative Examples 1 and 2 is due to the value of the ratio (HF/D1). From this verification result, it was found that the falling or tilting can be prevented by setting the ratio (HF/D1) to 1.6 or less. Since the first conductor layer 32F and the first conductor layer 32R are formed of the same material and have the same manufacturing process, the falling or tilting can be prevented by setting the ratio (HR/D1) to 1.6 or less.

According to the results of Reference Examples 1 and 2, in a case in which the width D1 is large, the falling or tilting does not occur even though the ratio (HF/D1) and the ratio (HR/D1) exceed 1.6. One of the reasons for this is that the bonding area between each of the first conductor layer 32F and the first conductor layer 32R and the other components is large. However, even in a case in which the width D1 is large as described above, in a case in which the ratio (HF/D1) and the ratio (HR/D1) are set to 1.6 or less, the falling or tilting is less likely to occur. Therefore, it is effective to set the ratio (HF/D1) and the ratio (HR/D1) to 1.6 or less in order to prevent the falling or tilting, regardless of the size of the width D1. From the results of FIG. 23, by setting the ratio (HF/D1) and the ratio (HR/D1) to 1.6 or less, the falling or tilting can be prevented even though the width D1 is set to a value smaller than 40 µm. As a result, it is possible to efficiently manufacture an ultrasound probe capable of supporting high-frequency drive.

At least the following matters are described in the present specification. Note that the components and the like corresponding to the above embodiments are shown in parentheses, but the present invention is not limited thereto.

(1)

An ultrasound probe (ultrasound probe 100) having a plurality of piezoelectric elements (piezoelectric elements 10) arranged in a first direction (left-right direction LR), the ultrasound probe (ultrasound probe 100) comprising:
  a support member (backing material 50) that supports the plurality of piezoelectric elements;
  an acoustic matching portion (acoustic matching portion 20) disposed on the plurality of piezoelectric elements; and
  a conductive member (conductive member 30Fr, conductive member 30Rr) and adjacent to the acoustic matching portion disposed on the plurality of piezoelectric elements and adjacent to the acoustic matching portion,
  in which each of the plurality of piezoelectric elements is formed of a laminate including a first conductive portion (first conductive portion 12), a piezoelectric portion (piezoelectric portion 11), and a second conductive portion (second conductive portion 13) which are sequentially laminated above the support member,
  the conductive member includes a conductor layer having a multi-layer structure, which is disposed on at least one end side of the acoustic matching portion in a second direction (front-rear direction FR) intersecting the first direction,
  the conductor layer having a multi-layer structure includes a plurality of first conductor layers (first conductor layers 32F, first conductor layers 32R) respectively bonded to the second conductive portions of the piezoelectric elements, and a second conductor layer (second conductor layer 31F, second conductor layer 31R) laminated on the plurality of first conductor layers and electrically connects the plurality of first conductor layers, and
  a ratio of a thickness (HF, HR) to a width (D1) of the first conductor layer is 1.6 or less, the width of the first conductor layer being a length of the first conductor layer in the first direction.

(2)

The ultrasound probe according to (1),
  in which the first conductor layer is formed by a heat-treated hardened silver paste having a Shore D hardness in a range of 80 or more and 85 or less.

(3)

The ultrasound probe according to (1) or (2),
  in which the width of the first conductor layer is 25 µm or more and less than 40 µm.

(4)

The ultrasound probe according to any one of (1) to (3),
  in which a width of each of the plurality of piezoelectric elements and the width of the first conductor layer are the same length, the width of each of the plurality of piezoelectric elements being a length of each of the plurality of piezoelectric elements in the first direction.

(5)

The ultrasound probe according to any one of (1) to (4),
  in which the conductive member is disposed on both end sides in the second direction.

(6)

The ultrasound probe according to any one of (1) to (5),
  in which a Shore D hardness of the first conductor layer is smaller than a Shore D hardness of the acoustic matching portion.

(7)

An ultrasound diagnostic apparatus comprising:
  the ultrasound probe according to any one of (1) to (6).

(8)

A manufacturing method of an ultrasound probe (ultrasound probe 100) which has a plurality of piezoelectric elements (piezoelectric elements 10) arranged in a first direction (left-right direction LR) and in which a width of the piezoelectric element is a predetermined value (D1), the width of the piezoelectric element being a length in the first direction,
  in which a direction intersecting the first direction is defined as a second direction (front-rear direction FR), and a direction perpendicular to the first direction and the second direction is defined as a third direction (up-down direction UD), and
  the manufacturing method comprises:
  a step (first step, FIG. 5) of fixing, to a support member (backing material 50), a sheet-like laminate (piezoelectric element 10S) which is perpendicular to the third direction and in which a first conductive portion (first conductive portion 12S), a piezoelectric portion (piezoelectric portion 11S), and a second conductive portion (second conductive portion 13S) are sequentially laminated;
  a step (second step, FIG. 8) of forming an acoustic matching portion (acoustic matching portion 20S) in a partial region in the second direction of an upper surface of the laminate, the upper surface being at an opposite side to a support member side;
  a step (third step, FIG. 11) of forming a first conductor layer (first conductor layer 32FS, first conductor layer 32RS) whose thickness (HF, HR) in the third direction is equal to or less than 1.6 times the predetermined value on at least one end side of the acoustic matching portion in the second direction on the upper surface of the laminate;

a step (fourth step, FIG. 14) of forming the plurality of piezoelectric elements by dividing the laminate on which the acoustic matching portion and the first conductor layer are formed into a plurality of parts in the first direction by cutting; and a step (seventh step, FIG. 20) of forming, on the first conductor layers (first conductor layers 32F, first conductor layers 32R) divided into the plurality of parts, a second conductor layer (second conductor layer 31F, second conductor layer 31R) extending over a plurality of the first conductor layers.

Although various embodiments have been described with reference to the drawings, it goes without saying that the present invention is not limited to such examples. It is obvious that a person skilled in the art is able to find various modification examples and adjustment examples within the scope of the appended claims, and it should be understood that these modification examples and adjustment examples naturally belong to the technical scope of the present invention. Further, the components according to the above-described embodiment may be randomly combined with each other, without departing from the spirit of the invention.

This application is based on Japanese Patent Application filed on Apr. 1, 2021 (JP2021-063176), the content of which is incorporated herein by reference.

EXPLANATION OF REFERENCES 10S, 10: piezoelectric element
11S, 11: piezoelectric portion
12S, 12: first conductive portion
13S, 13: second conductive portion
20S, 20: acoustic matching portion
21: first layer
22: second layer
23: third layer
30Fr, 30Rr: conductive member
31F, 31R: second conductor layer
32F, 32FS, 32RS, 32R: first conductor layer
40a: cutting region
40: insulating filling material
50: backing material
60Fr: front FPC
60Rr: rear FPC
61Fr, 61Rr: electrode pattern forming region
71, 72: line electrode
100: ultrasound probe

What is claimed is:

1. An ultrasound probe having a plurality of piezoelectric elements arranged in a first direction, the ultrasound probe comprising:
    a backing material that supports the plurality of piezoelectric elements;
    an acoustic matching portion disposed on the plurality of piezoelectric elements in a third direction; and
    a conductive member disposed on the plurality of piezoelectric elements in the third direction and adjacent to the acoustic matching portion in a second direction,
    wherein the second direction intersects the first direction,
    wherein the third direction is perpendicular to the first direction and the second direction,
    wherein each of the plurality of piezoelectric elements is formed of a laminate including a first conductive portion, a piezoelectric portion, and a second conductive portion which are sequentially laminated above the backing material,
    the conductive member includes a conductor layer having a multi-layer structure disposed on at least one end side of the acoustic matching portion in the second direction,
    the multi-layer structure has a plurality of first conductor layers respectively bonded to the second conductive portions of the piezoelectric elements, and a second conductor layer laminated on the plurality of first conductor layers and electrically connects the plurality of first conductor layers, and
    a ratio of a thickness to a width of the first conductor layer is 1.6 or less, the width of the first conductor layer being a first length of the first conductor layer in the first direction and the thickness of the first conductor layer being a second length of the first conductor layer in the third direction.

2. The ultrasound probe according to claim 1, wherein the first conductor layer is formed by a heat-treated hardened silver paste having a Shore D hardness in a range of 80 or more and 85 or less.

3. The ultrasound probe according to claim 1, wherein the width of the first conductor layer is 25 μm or more and less than 40 μm.

4. The ultrasound probe according to claim 2, wherein the width of the first conductor layer is 25 μm or more and less than 40 μm.

5. The ultrasound probe according to claim 1, wherein a width of each of the plurality of piezoelectric elements and the width of the first conductor layer are the same length, the width of each of the plurality of piezoelectric elements being a length of each of the plurality of piezoelectric elements in the first direction.

6. The ultrasound probe according to claim 2, wherein a width of each of the plurality of piezoelectric elements and the width of the first conductor layer are the same length, the width of each of the plurality of piezoelectric elements being a length of each of the plurality of piezoelectric elements in the first direction.

7. The ultrasound probe according to claim 3, wherein a width of each of the plurality of piezoelectric elements and the width of the first conductor layer are the same length, the width of each of the plurality of piezoelectric elements being a length of each of the plurality of piezoelectric elements in the first direction.

8. The ultrasound probe according to claim 4, wherein a width of each of the plurality of piezoelectric elements and the width of the first conductor layer are the same length, the width of each of the plurality of piezoelectric elements being a length of each of the plurality of piezoelectric elements in the first direction.

9. The ultrasound probe according to claim 1, wherein the conductive member is disposed on both end sides in the second direction.

10. The ultrasound probe according to claim 2, wherein the conductive member is disposed on both end sides in the second direction.

11. The ultrasound probe according to claim 3, wherein the conductive member is disposed on both end sides in the second direction.

12. The ultrasound probe according to claim 4, wherein the conductive member is disposed on both end sides in the second direction.

13. The ultrasound probe according to claim 5, wherein the conductive member is disposed on both end sides in the second direction.

14. The ultrasound probe according to claim 6 wherein the conductive member is disposed on both end sides in the second direction.

15. The ultrasound probe according to claim 7, wherein the conductive member is disposed on both end sides in the second direction.

16. The ultrasound probe according to claim 8, wherein the conductive member is disposed on both end sides in the second direction.

17. The ultrasound probe according to claim 1, wherein a Shore D hardness of the plurality of first conductor layers is smaller than a Shore D hardness of the acoustic matching portion.

18. An ultrasound diagnostic apparatus comprising: the ultrasound probe according to claim 1.

19. A method for manufacturing an ultrasound probe which has a plurality of piezoelectric elements arranged in a first direction, a width of the piezoelectric element being a predetermined value, the width of the piezoelectric element being a length in the first direction, wherein a second direction intersects the first direction, and wherein the third direction is perpendicular to the first direction and the second direction, the method comprising:

fixing, on a backing material, a sheet-like laminate and in which a first conductive portion, a piezoelectric portion, and a second conductive portion are sequentially laminated, the sheet-like laminate extending perpendicular to the third direction;

forming an acoustic matching portion in a partial region in the second direction of an upper surface of the sheet-like laminate, the upper surface being at an opposite side to a backing material side;

forming a first conductor layer on at least one end side of the acoustic matching portion in the second direction on the upper surface of the sheet-like laminate, wherein a thickness of the first conductor layer is equal to or less than 1.6 times the predetermined value, the thickness of the first conductor layer being a length of the first conductor layer in the third direction;

forming the plurality of piezoelectric elements by dividing the sheet-like laminate on which the acoustic matching portion and the first conductor layer are formed into a plurality of parts in the first direction by cutting; and forming, on the first conductor layers divided into the plurality of parts, a second conductor layer extending over a plurality of the first conductor layers.

* * * * *